(12) United States Patent
An et al.

(10) Patent No.: US 11,244,946 B2
(45) Date of Patent: Feb. 8, 2022

(54) SEMICONDUCTOR DEVICES AND METHODS FOR FABRICATING THEREOF

(71) Applicant: Samsung Electronics Co., Ltd., Suwon-si (KR)

(72) Inventors: Chang Mu An, Osan-si (KR); Sang Yeol Kang, Yongin-si (KR); Young-Lim Park, Anyang-si (KR); Jong-Bom Seo, Seoul (KR); Se Hyoung Ahn, Seoul (KR)

(73) Assignee: Samsung Electronics Co., Ltd.

( * ) Notice: Subject to any disclaimer, the term of this patent is extended or adjusted under 35 U.S.C. 154(b) by 29 days.

(21) Appl. No.: 16/946,487

(22) Filed: Jun. 24, 2020

(65) Prior Publication Data

US 2021/0125996 A1    Apr. 29, 2021

(30) Foreign Application Priority Data

Oct. 29, 2019    (KR) .................. 10-2019-0135307

(51) Int. Cl.
| | | |
|---|---|---|
| *H01L 29/76* | (2006.01) | |
| *H01L 27/108* | (2006.01) | |
| *H01L 29/94* | (2006.01) | |

(52) U.S. Cl.
CPC ...................... *H01L 27/10829* (2013.01)

(58) Field of Classification Search
CPC ......... H01L 27/10814; H01L 27/10829; H01L 27/10852; H01L 27/11507; H01L 28/90
USPC ........................................................ 257/301
See application file for complete search history.

(56) References Cited

U.S. PATENT DOCUMENTS

| | | | |
|---|---|---|---|
| 7,638,407 B2 | 12/2009 | Park et al. | |
| 7,723,182 B2 | 5/2010 | Jang et al. | |
| 9,337,149 B2 | 5/2016 | Im et al. | |
| 2007/0155115 A1* | 7/2007 | Horikawa | ......... H01L 21/02337 438/396 |
| 2011/0024874 A1 | 2/2011 | Park et al. | |
| 2012/0181510 A1* | 7/2012 | Avouris | ............ H01L 27/0688 257/29 |

FOREIGN PATENT DOCUMENTS

| | | |
|---|---|---|
| KR | 100388456 | 6/2003 |
| KR | 1020050067450 | 7/2005 |
| KR | 100951557 | 4/2010 |

* cited by examiner

*Primary Examiner* — Theresa T Doan
(74) *Attorney, Agent, or Firm* — Myers Bigel, P.A.

(57) ABSTRACT

Semiconductor device may include a landing pad and a lower electrode that is on and is connected to the landing pad and includes an outer portion and an inner portion inside the outer portion. The outer portion includes first and second regions. The semiconductor devices may also include a dielectric film on the first region of the outer portion on the lower electrode and an upper electrode on the dielectric film. The first region of the outer portion of the lower electrode may include a silicon (Si) dopant, the dielectric film does not extend along the second region of the outer portion. A concentration of the silicon dopant in the first region of the outer portion is different from a concentration of the silicon dopant in the second region of the outer portion and is higher than a concentration of the silicon dopant in the inner portion.

20 Claims, 25 Drawing Sheets

SEMICONDUCTOR DEVICES AND METHODS FOR FABRICATING THEREOF

CROSS-REFERENCE TO RELATED APPLICATION

This application claims priority under 35 U.S.C. § 119 to Korean Patent Application No. 10-2019-0135307 filed on Oct. 29, 2019 in the Korean Intellectual Property Office, the disclosure of which in its entirety is herein incorporated by reference.

FIELD

The present disclosure generally relates to a semiconductor device and a method for fabricating the same, and more particularly, to a semiconductor device including a capacitor as a data storage element and a method for fabricating the same.

BACKGROUND

In recent years, for large capacity and high integration of semiconductor devices, such as DRAM devices, design rules thereof also have continuously decreased. In order for a DRAM device to operate, there may be a minimum capacitance for each cell.

An increase in capacitance increases an amount of charge stored in the capacitor and may improve refresh characteristics of the semiconductor device. The improved refresh characteristics of the semiconductor device may improve the yield of the semiconductor device.

In order to increase the capacitance, a method for utilizing a dielectric film having a high dielectric constant for a capacitor or increasing a contact area between a lower electrode of the capacitor and the dielectric film is being studied.

SUMMARY

Aspects of the present disclosure provide semiconductor devices capable of improving the performance and reliability of an element through interface engineering between a lower electrode and a capacitor dielectric film.

Aspects of the present disclosure also provide methods for fabricating a semiconductor device capable of improving element performance and reliability through the interface engineering between a lower electrode and a capacitor dielectric film.

According to example embodiments of the present inventive concept, a semiconductor device includes a landing pad on a substrate, a lower electrode which is located on the landing pad, connected to the landing pad and includes an outer part and an inner part inside (e.g., enclosed by) the outer part, the outer part including a first region and a second region, a dielectric film extending along the first region of the outer part on the lower electrode, and an upper electrode on the dielectric film. The first region of the outer portion of the lower electrode includes a silicon (Si) dopant doped therein, the dielectric film does not extend along the second region of the outer part, a concentration of the silicon dopant in the first region of the outer part is different from the concentration of the silicon dopant in the second region of the outer part, and the concentration of the silicon dopant in the first region in the outer part is higher than a concentration of the silicon dopant in the inner part.

According to example embodiments of the present inventive concept, a semiconductor device includes a landing pad on a substrate, a lower electrode which is located on the landing pad, connected to the landing pad, and extends in a thickness direction of the substrate, at least one or more supporter patterns being in contact with a part of the lower electrode, a dielectric film extending along an outer surface of the lower electrode and an outer surface of the supporter pattern, and an upper electrode on the dielectric film. The lower electrode includes a silicon (Si) dopant doped along a part of the outer surface of the lower electrode (e.g., a first region that is adjacent to the dielectric film), and a concentration of the silicon dopant between the lower electrode and the dielectric film (e.g., a concentration of the silicon dopant of the first region of the lower electrode) is higher than the concentration of the silicon dopant between the lower electrode and the supporter pattern (e.g., a concentration of the silicon dopant of a first region of the lower electrode which is adjacent to the supporter pattern).

According to example embodiments of the present inventive concept, a semiconductor device includes a trench in a substrate, a gate electrode that is in (e.g., fill) a part of the trench, a buried contact disposed adjacent to a side of the gate electrode (e.g., on at least one side of the gate electrode) and connected to the substrate, a landing pad on the buried contact, an etching stop film which is located on the landing pad and exposes at least a part of the landing pad, a first supporter pattern which is disposed on the etching stop film to be spaced apart from the etching stop film, and has a first thickness, a second supporter pattern which is disposed on the first supporter pattern to be spaced apart from the first supporter pattern, and has a second thickness greater than the first thickness, a lower electrode which is located on the landing pad, and is in contact with the etching stop film, the first supporter pattern and the second supporter pattern, an insertion film on the lower electrode, a dielectric film extending along profiles of the insertion film, the first supporter pattern and the second supporter pattern, and an upper electrode on the dielectric film. The lower electrode includes a silicon doped region formed in a part of an outer surface of the lower electrode, and the insertion film is formed on the silicon doping region.

A method for fabricating a semiconductor device, forming a lower electrode on a landing pad, forming a supporter pattern being in contact with a part of a side wall of the lower electrode, after formation of the supporter pattern, forming a silicon processing region on an outer surface of the lower electrode, using a precursor containing silicon, forming a dielectric film along a profile of the lower electrode including the silicon processing region and a profile of the supporter pattern, and forming an upper electrode on the dielectric film.

However, aspects of the present disclosure are not limited to the one set forth herein. The above and other aspects of the present disclosure will become more apparent to one of ordinary skill in the art to which the present disclosure pertains by referencing the detailed description of the present invention given below.

BRIEF DESCRIPTION OF THE DRAWINGS

The above and other aspects and features of the present disclosure will become more apparent by describing some example embodiments thereof with reference to the attached drawings, in which.

DETAILED DESCRIPTION

Figure 1:
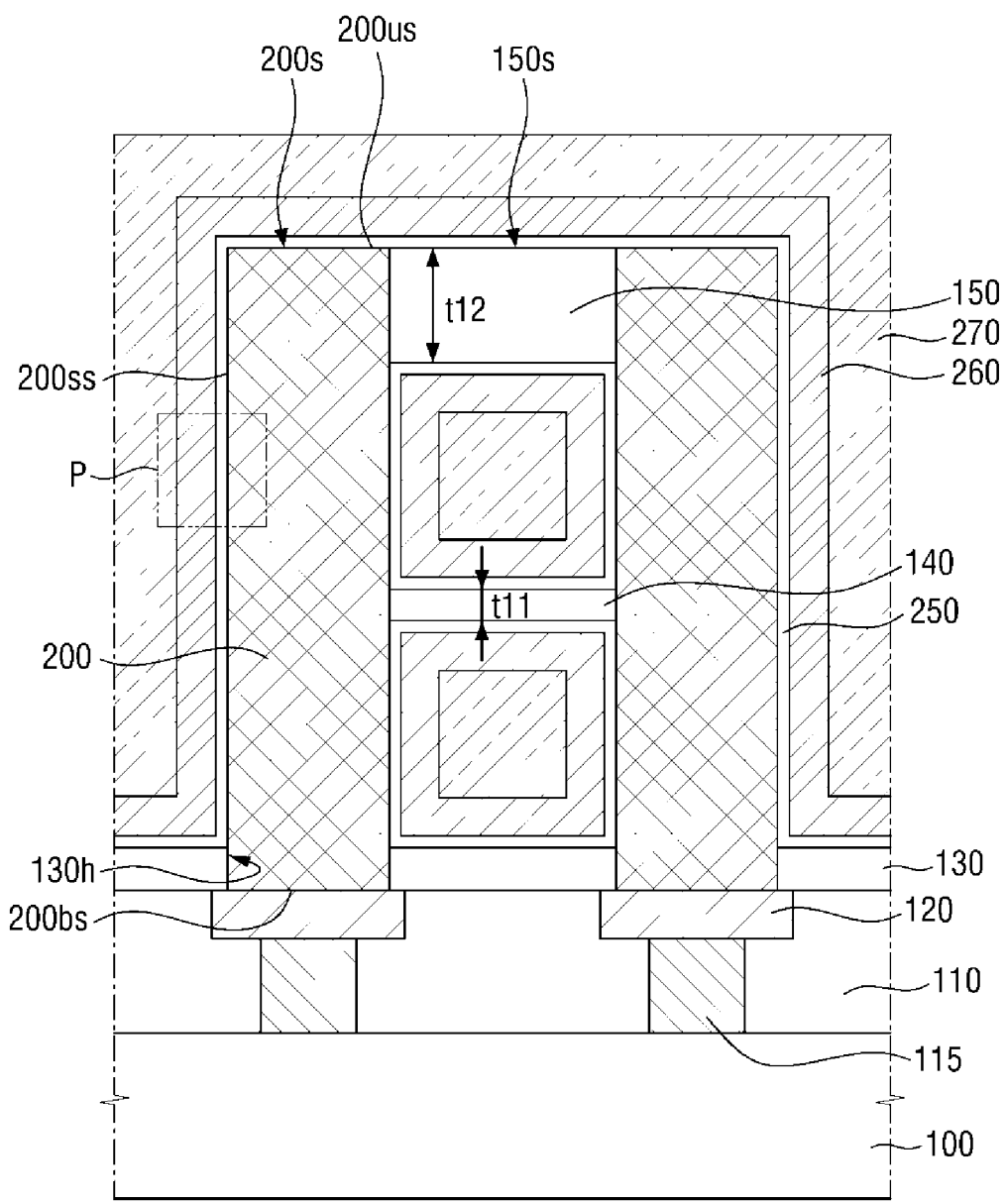
FIG. 1 is a diagram for explaining a semiconductor device according to some embodiments of the present inventive concept.
Figure 2:
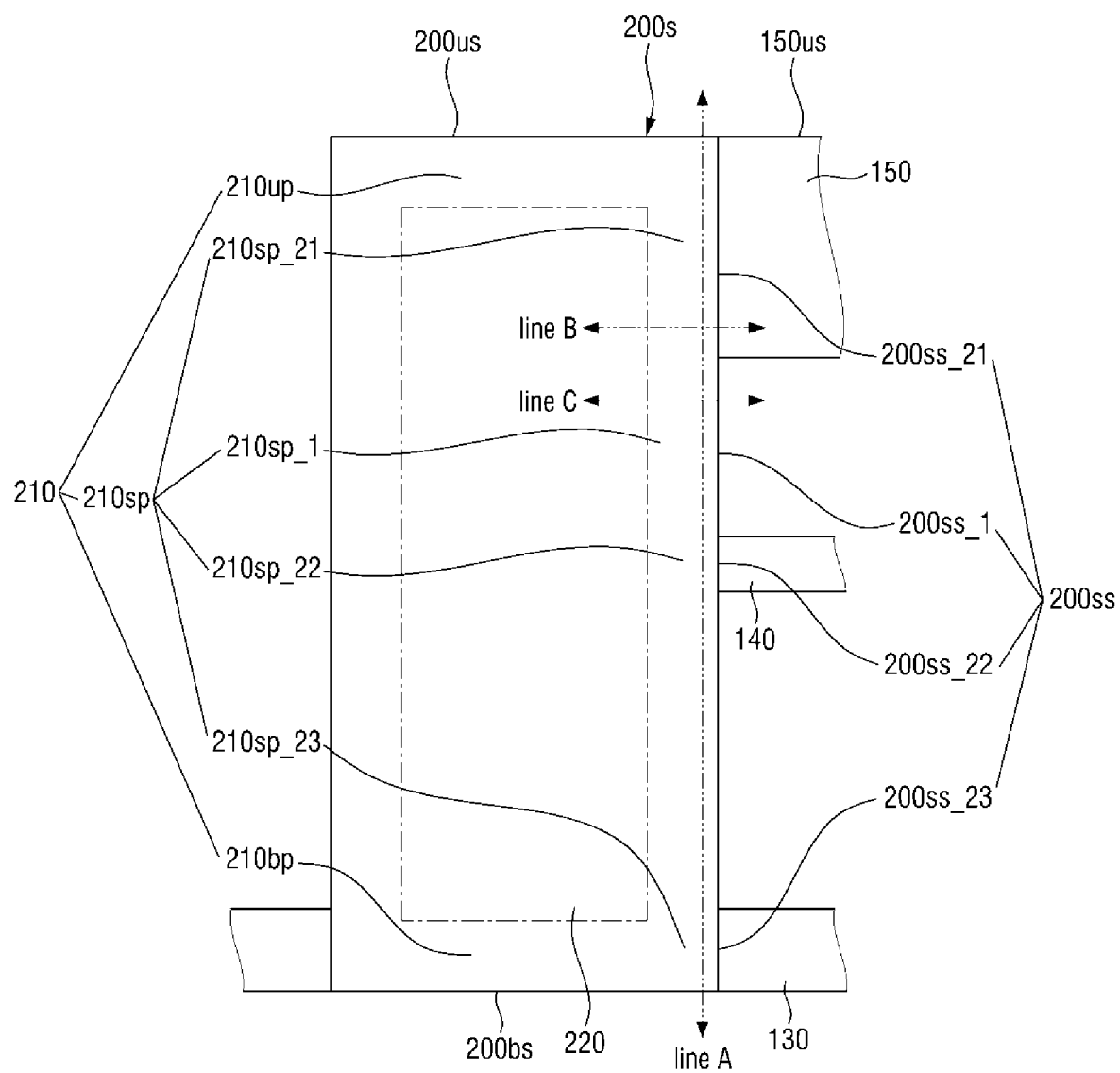
FIG. 2 is a diagram showing a lower electrode, supporter patterns and an etching stop film of FIG. 1.
Figure 3:
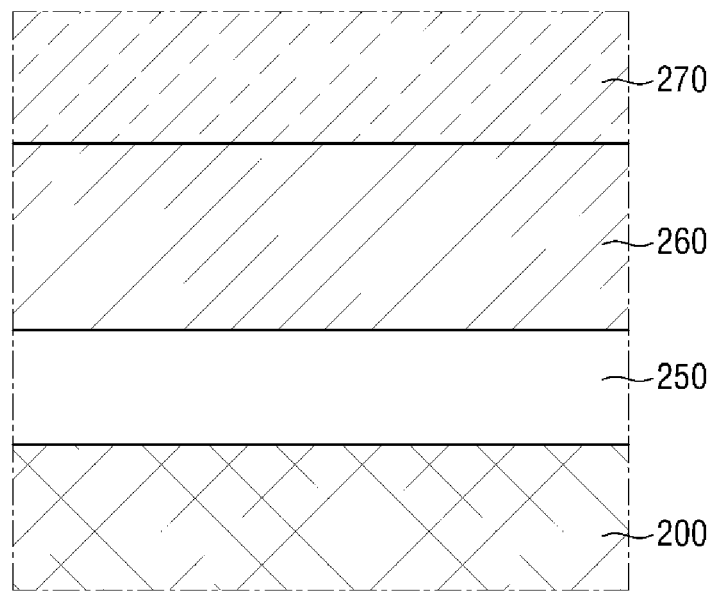
FIG. 3 is an enlarged view of a part P of FIG. 1.
Figure 4:
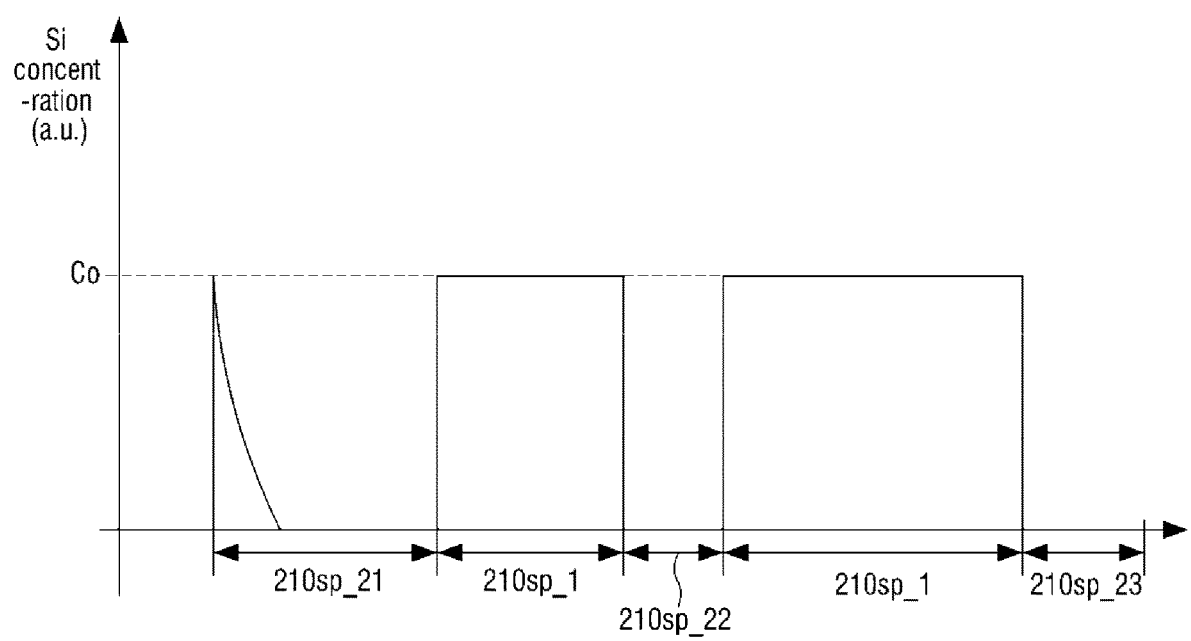
FIGS. 4 to 6 are schematic graphs showing a concentration of silicon (Si) dopant along a line A, a line B, and a line C of FIG. 2.
Figure 5:
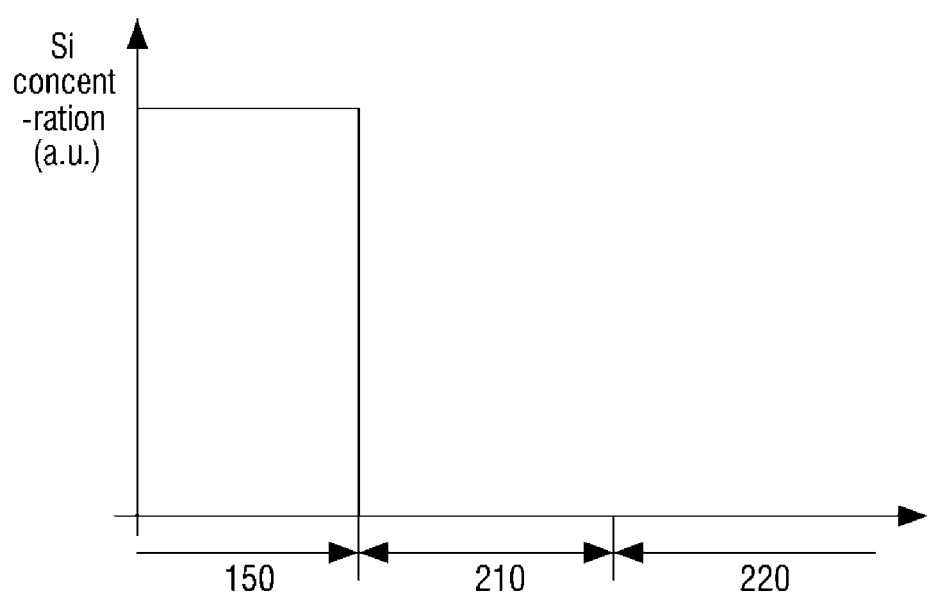
Figure 6:
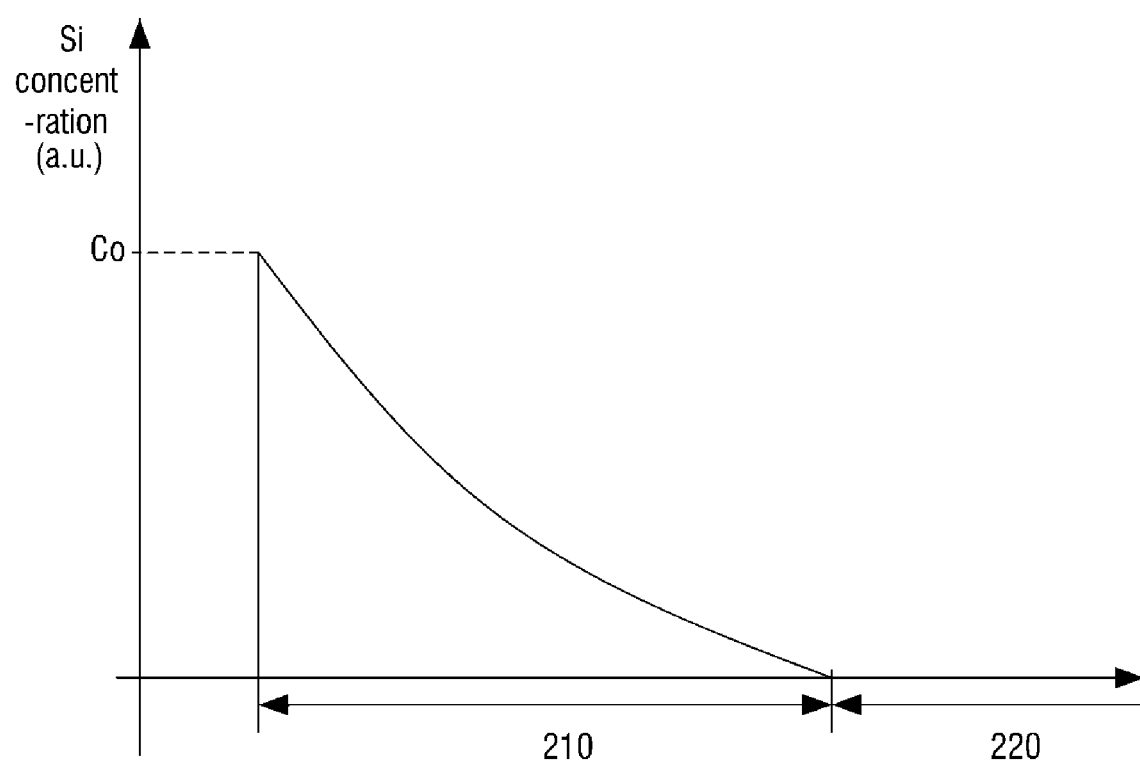

FIG. 1 is a diagram for explaining a semiconductor device according to some embodiments of the present inventive concept. FIG. 2 is a diagram showing a lower electrode, supporter patterns and an etching stop film of FIG. 1. FIG. 3 is an enlarged view of a part P of FIG. 1. FIGS. 4 to 6 are schematic graphs showing a concentration of silicon (Si) dopant along a line A, a line B, and a line C of FIG. 2.

Referring to FIGS. 1 to 3, a semiconductor device according to some embodiments of the present inventive concept may include a first landing pad 120, an etching stop film 130, a lower supporter pattern 140, an upper supporter pattern 150, a lower supporter pattern 140, a lower electrode 200, a capacitor dielectric film 250, an upper electrode 260 and an upper plate electrode 270.

The first landing pad 120 may be disposed on the substrate 100. The first landing pad 120 may be electrically connected to a conductive region formed on the substrate 100 or in the substrate 100.

The first landing pad 120 may be connected to the substrate 100 via a first storage contact 115. The first landing pad 120 may be disposed on the first storage contact 115.

A first interlayer insulating film 110 may be disposed on the substrate 100. The first storage contact 115 and the first landing pad 120 may be disposed in the first interlayer insulating film 110 on the substrate 100.

The substrate 100 may be bulk silicon or SOI (silicon-on-insulator). In some embodiments, the substrate 100 may be a silicon substrate or may include other materials, for example, but are not limited to, silicon germanium, SGOI (silicon germanium on insulator), indium antimonide, lead telluride, indium arsenide, indium phosphide, gallium arsenide or gallium antimonide. In the following description, the substrate 100 will be described as a silicon substrate.

The first interlayer insulating film 110 may include, for example, at least one of silicon oxide, silicon nitride, silicon oxynitride film (SiON), silicon oxycarbonitride film (SiOCN), and combinations thereof. The first storage contact 115 may include, for example, at least one of a semiconductor material doped with an impurity, a conductive silicide compound, a conductive metal nitride, and a metal. The first landing pad 120 may include, for example, at least one of a semiconductor material doped with an impurity, a conductive silicide compound, a conductive metal nitride, and a metal. In the semiconductor device according to some embodiments, the first landing pad 120 may include tungsten (W).

The etching stop film 130 may be disposed on the first interlayer insulating film 110. The etching stop film 130 may expose at least a part of the first landing pad 120. As an example, the etching stop film 130 may be disposed on the first landing pad 120. The etching stop film 130 may include a lower electrode hole 130h. The lower electrode hole 130h may expose at least a part of the first landing pad 120. The etching stop film 130 may include, for example, at least one of silicon nitride (SiN), silicon carbonitride (SiCN), silicon boron nitride (SiBN), silicon carbon oxide (SiCO), silicon oxynitride (SiON), silicon oxide (SiO) and silicon oxycarbonitride (SiOCN). For example, silicon carbon oxide (SiCO) includes silicon (Si), carbon (C) and oxygen (O), but does not mean a ratio between silicon (Si), carbon (C) and oxygen (O). The term "part" as used herein may be interchangeable with the term "portion."

The lower electrode 200 may be disposed on the first landing pad 120. The lower electrode 200 is connected to the first landing pad 120. The lower electrode 200 may extend longitudinally in a second direction DR2, which is a thickness direction of the substrate 100. A length of the lower electrode 200 extending in the second direction DR2 is greater than a length of the lower electrode 200 extending in a first direction DR1. In some embodiments, a length of the lower electrode 200 extending in the second direction DR2 is greater than a width of the lower electrode 200 in the first direction DR1. The lower electrode 200 may have, for example, a pillar shape. "An element having a pillar shape" (or similar language) as used herein refers to an element that includes a bottom surface and a vertical portion extending from the bottom surface in a vertical direction. The vertical portion of the element may or may not be perpendicular to the bottom surface.

Here, the second direction DR2 may be a direction parallel to the thickness direction of the substrate 100. The first direction DR1 may be a direction intersecting the second direction DR2 and parallel to the upper surface of the substrate 100 or the upper surface of the first interlayer insulating film 110. In some embodiments, the first direction DR1 may be parallel to a surface of the substrate 100 and the second direction DR2 may be perpendicular to the first direction DR1 as illustrated in FIG. 1.

The lower electrode 200 may include an outer surface 200s that defines the outer shape of the lower electrode 200. The outer surface 200s of the lower electrode 200 may include a bottom surface 200bs facing the upper surface of the first landing pad 120, a side wall 200ss extending in the second direction DR2, and an upper surface 200us facing the bottom surface 200bs of the lower electrode 200. The side wall 200ss of the lower electrode 200 connects the bottom surface 200bs of the lower electrode 200 and the upper surface 200us of the lower electrode 200.

In the semiconductor device according to some embodiments, a part of the lower electrode 200 may be disposed in the lower electrode hole 130h. The lower electrode 200 may be connected to the first landing pad 120 past the lower electrode hole 130h. For example, a part of the side wall 200ss of the lower electrode 200 may be in contact with the etching stop film 130. In some embodiments, a portion of the lower electrode 200 may extend through the etching stop film 130 and may contact the etching stop film 130 as illustrated in FIG. 1G.

The lower electrode 200 may include, for example, but is not limited to, a doped semiconductor material, a conductive metal nitride (e.g., titanium nitride, tantalum nitride, niobium nitride, tungsten nitride, etc.), a metal (e.g., ruthenium, iridium, titanium, tantalum, etc.), and/or a conductive metal oxide (e.g., iridium oxide, niobium oxide, etc.). As used herein the term "and/or" includes any and all combinations of one or more of the associated listed items.

In the semiconductor device according to some embodiments, the lower electrode 200 may include titanium nitride (TiN). Further, in the semiconductor device according to some embodiments, the lower electrode 200 may include niobium nitride (NbN).

The lower electrode 200 may include a silicon (Si) dopant. The silicon (Si) dopant may be doped in the lower electrode 200 and/or on the outer surface 200s of the lower electrode 200. The description of the lower electrode 200 and the silicon (Si) dopant will be described below in detail.

The lower supporter pattern 140 may be disposed on the etching stop film 130. The lower supporter pattern 140 is spaced apart from the etching stop film 130 in the second direction DR2. The lower supporter pattern 140 may be in contact with the lower electrode 200. The lower supporter pattern 140 may be in contact with a part of the side wall 200ss of the lower electrode 200. The lower supporter pattern 140 may connect the lower electrodes 200 adjacent to each other in the first direction DR1. Although FIG. 1 shows that two lower electrodes 200 are connected by the lower supporter pattern 140, this is merely for convenience of explanation and the present inventive concept is not limited thereto.

The upper supporter pattern 150 may be disposed on the lower supporter pattern 140. The upper supporter pattern 150 is spaced apart from the lower supporter pattern 140 in the second direction DR2. The upper supporter pattern 150 may be in contact with the lower electrode 200. The upper supporter pattern 150 may be in contact with a part of the side wall 200ss of the lower electrode 200. Although FIG. 1 shows that two lower electrodes 200 are connected by the upper supporter pattern 150, this is merely for convenience of explanation and the present inventive concept is not limited thereto.

The lower supporter pattern 140 and the upper supporter pattern 150 may include, for example, at least one of silicon nitride (SiN), silicon carbonitride (SiCN), silicon boron nitride (SiBN), silicon carbon oxide (SiCO), silicon oxynitride (SiON), silicon oxide (SiO), and silicon oxycarbonitride (SiOCN). In the semiconductor device according to some embodiments, the lower supporter pattern 140 and the upper supporter pattern 150 may include silicon carbonitride (SiCN) or silicon nitride, respectively.

In the semiconductor device according to some embodiments, a thickness t11 of the lower supporter pattern 140 in the second direction DR2 may be smaller than a thickness t12 of the upper supporter pattern 150 in the second direction DR2. Unlike the shown example, the semiconductor device according to some embodiments may include only one of the lower supporter pattern 140 and the upper supporter pattern 150. In some embodiments, in the semiconductor device according to some embodiments, an additional supporter pattern may be disposed between the etching stop film 130 and the lower supporter pattern 140, or between the lower supporter pattern 140 and the upper supporter pattern 150.

The capacitor dielectric film 250 may be disposed on the lower electrode 200. The capacitor dielectric film 250 may be formed along the outer surface 200s of the lower electrode 200, the outer surface of the lower supporter pattern 140, the outer surface of the upper supporter pattern 150 and the upper surface of the etching stop film 130. The capacitor dielectric film 250 may extend along the profiles of the lower electrode 200, the upper supporter pattern 150, the lower supporter pattern 140 and the etching stop film 130. In some embodiments, the capacitor dielectric film 250 may have a uniform thickness as illustrated in FIG. 1.

Since the lower supporter pattern 140 and the upper supporter pattern 150 are in contact with the lower electrode 200, the capacitor dielectric film 250 does not extend between the lower supporter pattern 140 and the lower electrode 200, and between the upper supporter pattern 150 and the lower electrode 200. Also, the capacitor dielectric film 250 does not extend between the etching stop film 130 and the lower electrode 200. In the semiconductor device according to some embodiments, the capacitor dielectric film 250 may be in contact with the lower electrode 200. The capacitor dielectric film 250 may be in contact with the outer surface of the upper supporter pattern 150, the outer surface of the lower supporter pattern 140 and the upper surface of the etching stop film 130.

The capacitor dielectric film 250 may include, for example, but is not limited, to, one of silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof. Although the capacitor dielectric film 250 is shown as a single film, this is merely for convenience of explanation and the present inventive concept is not limited thereto.

In the semiconductor device according to some embodiments, the capacitor dielectric film 250 may include a stacked film structure in which multiple films (e.g., zirconium oxide, aluminum oxide, and zirconium oxide) are sequentially stacked.

In the semiconductor device according to some embodiments, the capacitor dielectric film 250 may include a dielectric film including hafnium (Hf).

In the semiconductor device according to some embodiments, the capacitor dielectric film 250 may have a stacked film structure of a ferroelectric material film and a paraelectric material film.

The ferroelectric material film may have ferroelectric properties. The ferroelectric material film may have a thickness to the extent of having the ferroelectric properties. The range of the thickness of the ferroelectric material film having ferroelectric properties may vary depending on the ferroelectric material.

For example, the ferroelectric material film may include monometal oxide. The ferroelectric material film may include a monometal oxide film. Here, the monometal oxide may be a binary compound consisting of a single metal and oxygen. The ferroelectric material film containing a monometal oxide may have an orthorhombic crystal system.

In some embodiments, the metal included in the monometal oxide film may be hafnium (Hf). The monometal oxide film may be a hafnium oxide film (HfO). Here, the hafnium oxide film may have a chemical formula that matches stoichiometry or a chemical formula that does not match stoichiometry.

In some embodiments, the metal included in the monometal oxide film may be one of rare earth metals belonging to lanthanoids. The monometal oxide film may be a rare earth metal oxide film belonging to lanthanoids. Here, the rare earth metal oxide film belonging to the lanthanoids may have a chemical formula that matches the stoichiometry, or may have a chemical formula that does not match the stoichiometry.

The ferroelectric material film may further include a dopant doped in the monometal oxide film. Although a doping concentration may differ depending on the type of the dopant, a doping concentration of the dopant contained in the ferroelectric material film may be 10% or less.

In some embodiments, the monometal oxide film is a hafnium oxide film, and the dopant may include at least one of gadolinium (Gd), silicon (Si), aluminum (Al), yttrium (Y), lanthanum (La), scandium (Sc), cerium (Ce), dysprosium (Dy), tantalum (Ta), strontium (Sr), and niobium (Nb). In some embodiments, the monometal oxide film is a rare earth metal oxide film of lanthanoids, and the dopant may include at least one of silicon (Si), aluminum (Al), hafnium (Hf), zirconium (Zr), and niobium (Nb).

In some embodiments, the ferroelectric material film may not include a dopant doped in the monometal oxide film.

When the ferroelectric material film includes the monometal oxide film, the ferroelectric material film may have a thickness of, for example, 1 nm or more and 10 nm or less.

For example, the ferroelectric material film may include a bimetal oxide. The ferroelectric material film may include a bimetal oxide film. Here, the bimetal oxide may be a ternary compound consisting of two metals and oxygen. The ferroelectric material film containing the bimetal oxide may have an orthorhombic crystal system.

The metal contained in the bimetal oxide film may be, for example, hafnium (Hf) and zirconium (Zr). The bimetal oxide film may be a hafnium zirconium oxide film ($Hf_xZr_{(1-x)}O$). In the bimetal oxide film, x may be 0.2 or more and 0.8 or less. Here, the hafnium zirconium oxide film ($Hf_xZr_{(1-x)}O$) may have a chemical formula that matches the stoichiometry or may have a chemical formula that does not match the stoichiometry.

For example, the ferroelectric material film may further include a dopant doped in the bimetal oxide film. The dopant may include at least one of gadolinium (Gd), silicon (Si), aluminum (Al), yttrium (Y), lanthanum (La), scandium (Sc), cerium (Ce), dysprosium (Dy), tantalum (Ta), and strontium (Sr). In some embodiments, the ferroelectric material film may not include a doped dopant in the bimetal oxide film.

When the ferroelectric material film includes the bimetal oxide film, the ferroelectric material film 132 may have a thickness of, for example, 1 nm or more and 20 nm or less.

The paraelectric material may have a positive dielectric constant, and the ferroelectric material may have a negative dielectric constant in a certain interval. That is, the paraelectric material has a positive capacitance, and the ferroelectric material may have a negative capacitance.

In general, if two or more capacitors having a positive capacitance are connected in series, the sum of the capacitances decreases. However, if a negative capacitor having a negative capacitance and a positive capacitor having a positive capacitance are connected in series, the sum of the capacitances increases.

The upper electrode 260 may be disposed on the capacitor dielectric film 250. The upper electrode 260 may be formed along a profile of the capacitor dielectric film 250.

The upper electrode 260 may include, for example, but is not limited to, a doped semiconductor material, a conductive metal nitride (e.g., titanium nitride, tantalum nitride, niobium nitride or tungsten nitride, etc.), a metal (e.g., ruthenium, iridium, titanium or tantalum etc.), and a conductive metal oxide (e.g., iridium oxide or niobium oxide). In the semiconductor device according to some embodiments, the upper electrode 260 may include titanium nitride (TiN). Further, in the semiconductor device according to some embodiments, the upper electrode 260 may include niobium nitride (NbN).

The upper plate electrode 270 may be disposed on the upper electrode 260. The upper plate electrode 270 may include, for example, at least one of an element semiconductor material film or a compound semiconductor material film. The upper plate electrode 270 may include a doped n-type impurity or a p-type impurity. The element semiconductor material film may include, for example, one of a silicon film or a germanium film. The compound semiconductor material film may include, for example, a silicon germanium film. In the semiconductor device according to some embodiments, the upper plate electrode 270 may include a silicon germanium film.

Unlike the shown example, the upper plate electrode 270 may not be formed between the upper supporter pattern 150 and the lower supporter pattern 140 and/or between the lower supporter pattern 140 and the etching stop film 130.

In FIGS. 1 and 2, the lower electrode 200 may include an outer part 210 and an inner part 220 inside the outer part 210. The outer part 210 of the lower electrode 200 may wrap the inner part 220 of the lower electrode 200. The outer part 210 of the lower electrode 200 may include the outer surface 200s of the lower electrode 200. The outer part 210 of the lower electrode 200 is defined as a region having a thickness, while including the outer surface 200s of the lower electrode 200. Thus, the outer part 210 of the lower electrode 200 may have any thickness. That is, the ratio of the thickness of the outer part 210 of the lower electrode 200 to the width of the lower electrode 200 in the first direction DR1 may be larger than 0 and smaller than 0.5.

The outer part 210 of the lower electrode 200 may include a bottom region 210bp, an upper surface region 210up, and a side surface region 210sp. The side surface region 210sp of the outer part 210 may be a region extending from the bottom surface 200bs of the lower electrode 200 to the upper surface 200us of the lower electrode 200.

The side surface region 210sp of the outer part 210 may include a side wall 200ss of the lower electrode 200. Since the side surface region 210sp of the outer part 210 extends to the bottom surface 200bs of the lower electrode 200, the bottom region 210bp of the outer part 210 may include a part of the bottom surface 200bs of the lower electrode 200. Since the side surface region 210sp of the outer part 210 extends to the upper surface 200us of the lower electrode 200, the upper surface region 210up of the outer part 210 may include a part of the upper surface 200us of the lower electrode 200.

The side surface region 210sp of the outer part 210 may be in contact with the etching stop film 130, the lower supporter pattern 140, and the upper supporter pattern 150. The side surface region 210sp of the outer part 210 that is not in contact with the etching stop film 130, the lower supporter pattern 140, and the upper supporter pattern 150 may be a first portion 210sp_1 of the side surface region 210sp of the outer part 210.

A portion in which the lower electrode 200 and the upper supporter pattern 150 are in contact with each other may be a second_1 portion 210sp_21 of the side surface region 210sp of the outer part 210. A portion in which the lower electrode 200 and the lower supporter pattern 140 are in contact with each other may be a second_2 portion 210sp_22 of the side surface region 210sp of the outer part 210. A portion in which the lower electrode 200 and the etching stop film 130 are in contact with each other may be a second_3 portion 210sp_23 of the side surface region 210sp of the outer part 210.

The capacitor dielectric film 250 may extend along the upper surface region 210up of the outer part 210, and the first portion 210sp_1 of the side surface region 210sp of the outer part 210. The capacitor dielectric film 250 does not extend along the bottom region 210bp of the outer part 210, the second_2 portion 210sp_22 of the side surface region 210sp of the outer part 210, and the second_3 portion 210sp_23 of the side surface region 210sp of the outer part 210.

The region in which the capacitor dielectric film 250 is formed may be a first region of the outer part 210 of the lower electrode 200. The region in which the capacitor dielectric film 250 is not formed may be a second region of the outer part 210 of the lower electrode 200. The second_1 portion 210sp_21 of the side surface region 210sp of the outer part 210 which is in contact with the upper supporter pattern 150 may include the first region of the outer part 210 of the lower electrode 200 and the second region of the outer part 210 of the lower electrode 200.

The side wall 200ss of the lower electrode 200 that is not in contact with the etching stop film 130, the lower supporter pattern 140 and the upper supporter pattern 150 may be a first portion 200ss_1 of the side wall 200ss of the lower electrode 200. The portion in which the lower electrode 200 is in contact with the upper supporter pattern 150 may be a second_1 portion 200ss_21 of the side wall 200ss of the lower electrode 200. The portion in which the lower electrode 200 is in contact with the lower supporter pattern 140 may be a second_2 portion 200ss_22 of the side wall 200ss of the lower electrode 200. The portion in which the lower electrode 200 is in contact with the etching stop film 130 may be a second_3 portion 200ss_23 of the side wall 200ss of the lower electrode 200.

The second_1 portion 200ss_21 of the side wall 200ss of the lower electrode 200 is an interface between the lower electrode 200 and the upper supporter pattern 150. The second_2 portion 200ss_22 of the side wall 200ss of the lower electrode 200 is an interface between the lower electrode 200 and the lower supporter pattern 140. The second_3 portion 200ss_23 of the side wall 200ss of the lower electrode 200 is an interface between the lower electrode 200 and the etching stop film 130.

The second_1 portion 210sp_21 of the side surface region 210sp of the outer part 210 includes the second_1 portion 200ss_21 of the side wall 200ss of the lower electrode 200. The second_2 portion 210sp_22 of the side surface region 210sp of the outer part 210 includes the second_2 portion 200ss_22 of the side wall 200ss of the lower electrode 200. The second_3 portion 210sp_23 of the side surface region 210sp of the outer part 210 includes a second_3 portion 200ss_23 of the side wall 200ss of the lower electrode 200.

The capacitor dielectric film 250 may extend along the first portion 200ss_1 of the side wall 200ss of the lower electrode 200, and the upper surface 200us of the lower electrode 200. The capacitor dielectric film 250 does not extend along the bottom surface 200bs of the lower electrode 200, the second_1 portion 200ss_21, the second_2 portion 200ss_22 of the side wall 200ss of the lower electrode 200, and the second_3 portion 200ss_23 of the side wall 200ss of the lower electrode 200.

The region in which the capacitor dielectric film 250 is formed may be the first region of the outer surface 200s of the lower electrode 200. The region in which the capacitor dielectric film 250 is not formed may be the second region of the outer surface 200s of the lower electrode 200.

FIG. 4 is a diagram schematically showing a change in concentration of a silicon (Si) dopant in the side surface region 210sp of the outer part 210 of the lower electrode 200. In some embodiments, the change in concentration of the silicon (Si) dopant shown in FIG. 4 may be substantially the same as the change in concentration of the silicon (Si) dopant on the side wall 200ss of the lower electrode 200. FIG. 4 may show a change in concentration of silicon (Si) dopant in the side surface region 210sp of the outer part 210 from the upper surface 200us of the lower electrode 200 to the bottom surface 200bs of the lower electrode 200. In FIG. 4, the concentration ($/cm^3$) of silicon (Si) only indicates the magnitude of the concentration for each region. In FIG. 4, the concentration of silicon (Si) does not indicate a quantified concentration value.

In FIG. 4, as it goes away from the upper surface 200us of the lower electrode 200, the concentration of silicon (Si) dopant in the second_1 portion 210sp_21 of the side surface region 210sp of the outer part 210 decreases. Thereafter, the concentration of the silicon (Si) dopant in the second_1 portion 210sp_21 of the side surface region 210sp of the outer part 210 may be 0. The second_1 portion 210sp_21 of the side surface region 210sp of the outer part 210 includes first sub-region containing silicon (Si) dopant, and a second sub-region containing no silicon (Si) dopant.

Here, the expression "concentration is 0" does not mean that silicon (Si) dopant does not exist. The expression "concentration is 0" may mean that the amount of the silicon (Si) dopant is smaller than a detection limit of an analytical apparatus.

The concentration of the silicon (Si) dopant may be 0 in the second_2 portion 210sp_22 of the side surface region 210sp of the outer part 210, and the second_3 portion 210sp_23 of the side surface region 210sp of the outer part 210. On the other hand, the concentration of the silicon (Si) dopant may be $C_0$ in the first portion 210sp_1 of the side surface region 210sp of the outer part 210.

In other words, as it goes away from the upper surface 200us of the lower electrode 200, the concentration of silicon (Si) dopant decreases in the second_1 portion 200ss_21 of the side wall 200ss of the lower electrode 200. Thereafter, the concentration of the silicon (Si) dopant may be 0 in the second_1 portion 200ss_21 of the side wall 200ss of the lower electrode 200. The second_1 portion 200ss_21 of the side wall 200ss of the lower electrode 200 may include a portion containing a silicon (Si) dopant and a portion containing no silicon (Si) dopant.

Subsequently, the concentration of the silicon (Si) dopant may be 0 in the second_2 portion 200ss_22 of the side wall 200ss of the lower electrode 200, and the second_3 portion 200ss_23 of the side wall 200ss of the lower electrode 200.

The concentration of the silicon (Si) dopant in the first portion 200ss_1 of the side wall 200ss of the lower electrode 200 may be $C_0$.

The concentration of the silicon (Si) dopant in the upper surface region 210up of the outer part 210 may be substantially the same as the concentration of the silicon (Si) dopant in the first portion 210sp_1 of the side surface region 210sp of the outer part 210. Therefore, the concentration of the silicon (Si) dopant may be $C_0$ in the upper surface region 210up of the outer part 210 or the upper surface 210us of the lower electrode 200.

At least a part of the outer part 210 of the lower electrode 200 may include a silicon (Si) dopant. In the semiconductor device according to some embodiments, the outer part 210 of the lower electrode 200 may include a region doped with a silicon (Si) dopant, and a region not doped with a silicon (Si) dopant.

The capacitor dielectric film 250 extends along the first portion 210sp_1 of the side surface region 210sp of the outer part 210. However, the capacitor dielectric film 250 does not extend along the second_2 portion 210sp_22 of the side surface region 210sp of the outer part 210 and the second_3 portion 210sp_23 of the side surface region 210sp of the outer part 210.

The concentration of silicon (Si) dopant in the first portion 210sp_1 of the side surface region 210sp of the outer part 210 is different from the concentration of the silicon (Si) dopant in the second_1 portion 210sp_21 of the side surface region 210sp of the outer part 210, the second_2 portion 210sp_22 of the side surface region 210sp of the outer part 210, and the second_3 portion 210sp_23 of the side surface region 210sp of the outer part 210. For example, the concentration of the silicon (Si) dopant in the first portion 210sp_1 of the side surface region 210sp of the outer part 210 is greater than the concentration of the silicon (Si) dopant in the second_1 portion 210sp_21 of the side surface region 210sp of the outer part 210, the second_2 portion 210sp_22 of the side surface region 210sp of the outer part 210, and the second_3 portion 210sp_23 of the side surface region 210sp of the outer part 210.

Here, the phrase "a concentration of a dopant in a region" may refer to an average concentration of the dopant in the region. In other words, although there is a portion in which the concentration of silicon (Si) dopant is high in the second_1 portion 210sp_21 of the side surface region 210sp of the outer part 210, the average concentration of the silicon (Si) dopant in the second_1 portion 210sp_21 of the side surface region 210sp of the outer part 210 is smaller than the average concentration of the silicon (Si) dopant in the first portion 210sp_1 of the side surface region 210sp of the outer part 210.

For example, a portion of the outer part 210 of the lower electrode 200 in which the capacitor dielectric film 250 is formed may be a region doped with the silicon (Si) dopant.

The lower electrode 200 may include the silicon (Si) dopant doped along at least a part of the outer surface 200s of the lower electrode 200. In the semiconductor device according to some embodiments, the outer surface 200s of the lower electrode 200 may include a region doped with silicon (Si) dopant, and a region not doped with silicon (Si) dopant.

The concentration of the silicon (Si) dopant in the first portion 200ss_1 of the side wall 200ss of the lower electrode 200 is greater than the concentration of the silicon (Si) dopant in the second_1 portion 200ss_21 of the side wall 200ss of the lower electrode 200, the second_2 portion 200ss_22 of the side wall 200ss of the lower electrode 200, and the second_3 portion 200ss_23 of the side wall 200ss of the lower electrode 200.

In other words, the concentration ($C_0$) of the silicon (Si) dopant between the lower electrode 200 and the capacitor dielectric film 250 is greater than the concentration of the silicon (Si) dopant between the lower electrode 200 and the upper supporter pattern 150, the concentration of the silicon (Si) dopant between the lower electrode 200 and the lower supporter pattern 140, and the concentration of silicon (Si) dopant between the lower electrode 200 and the etching stop film 130.

In FIG. 5, the second_1 portion 210sp_21 of the side surface region 210sp of the outer part 210 that is in contact with the upper supporter pattern 150 may not contain silicon (Si) dopant. At the boundary in which the upper supporter pattern 150 and the lower electrode 200 meet, the concentration of the silicon (Si) dopant may decrease sharply.

Since the upper supporter pattern 150 includes an insulating material containing silicon, the concentration of silicon (Si) shown in the upper supporter pattern 150 does not mean the concentration of silicon (Si) dopant contained in the outer part 210 of the lower electrode 200.

In the semiconductor device according to some embodiments, silicon (Si) included in the upper supporter pattern 150 may not be diffused into the lower electrode 200. As a result, the second_1 portion 210sp_21 of the side surface region 210sp of the outer part 210 may not contain silicon (Si) dopant. The second_2 portion 210sp_22 of the side surface region 210sp of the outer part 210 and the second_3 portion 210sp_23 of the side surface region 210sp of the outer part 210 may also be the same as the second_1 portion 210sp_21 of the side surface region 210sp of the outer part 210. A concentration of the silicon (Si) dopant in each of the second_2 portion 210sp_22 of the side surface region 210sp and the second_3 portion 210sp_23 of the side surface region 210sp may be the same or similar to that shown in FIG. 5.

FIG. 6 may show a change in concentration of silicon (Si) dopant in the first portion 210sp_1 of the side surface region 210sp of the outer part 210 in which the capacitor dielectric film 250 is formed. The concentration of silicon (Si) dopant contained in the outer part 210 of the lower electrode 200 decreases as it goes away from the outer surface 200s of the lower electrode 200.

In the semiconductor device according to some embodiments, the concentration of the silicon (Si) dopant in the first portion 210sp_1 of the side surface region 210sp of the outer part 210 is greater than the concentration of the silicon (Si) dopant in the inner part 220 of the lower electrode 200.

For example, the outer part 210 of the lower electrode 200 may contain silicon (Si) dopant, and the inner part 220 of the lower electrode 200 may not contain silicon (Si) dopant. The inner part 220 of the lower electrode 200 may be in a state in which silicon (Si) is undoped. In some embodiments, the inner part 220 of the lower electrode 200 may be devoid of silicon (Si).

Figure 7:
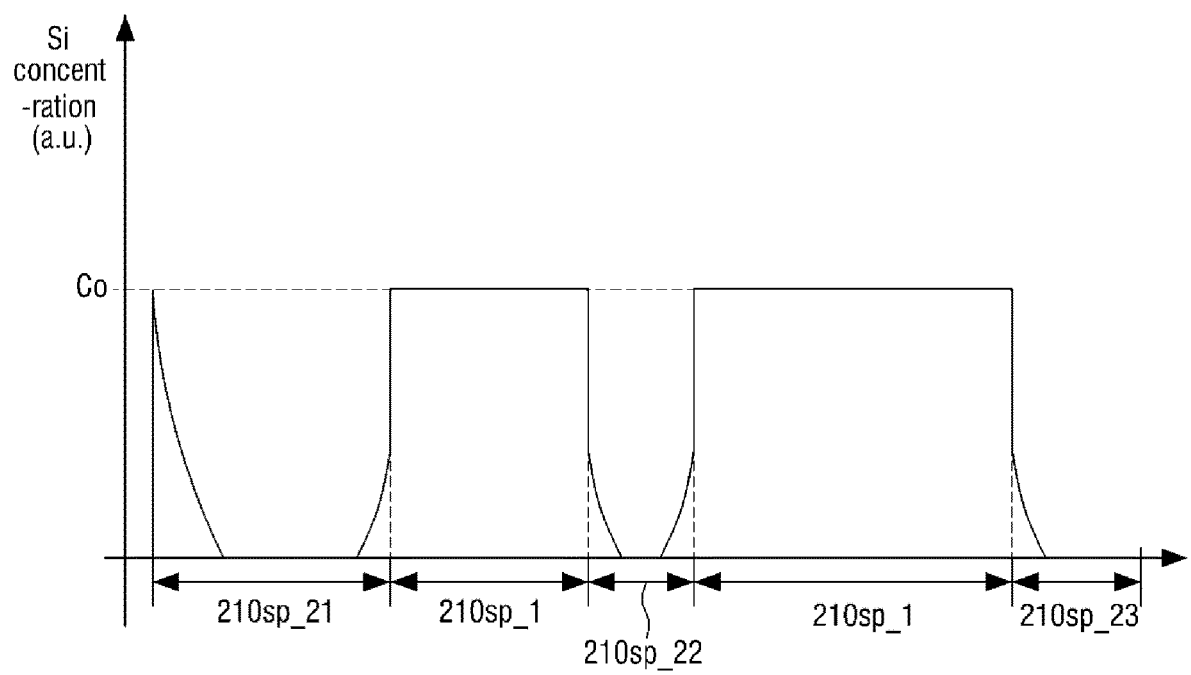
FIG. 7 is a schematic graph showing a concentration of silicon (Si) dopant along a line A of FIG. 2.
Figure 8:
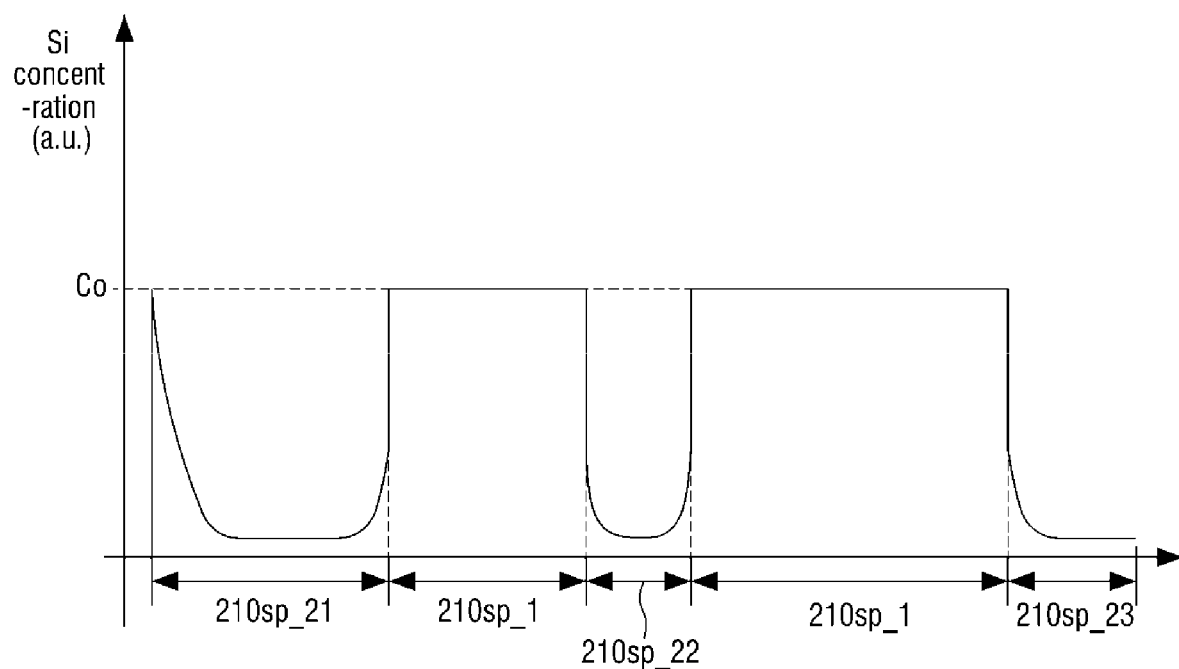
FIG. 8 is a schematic graph showing a concentration of silicon (Si) dopant along a line A of FIG. 2.
Figure 9:
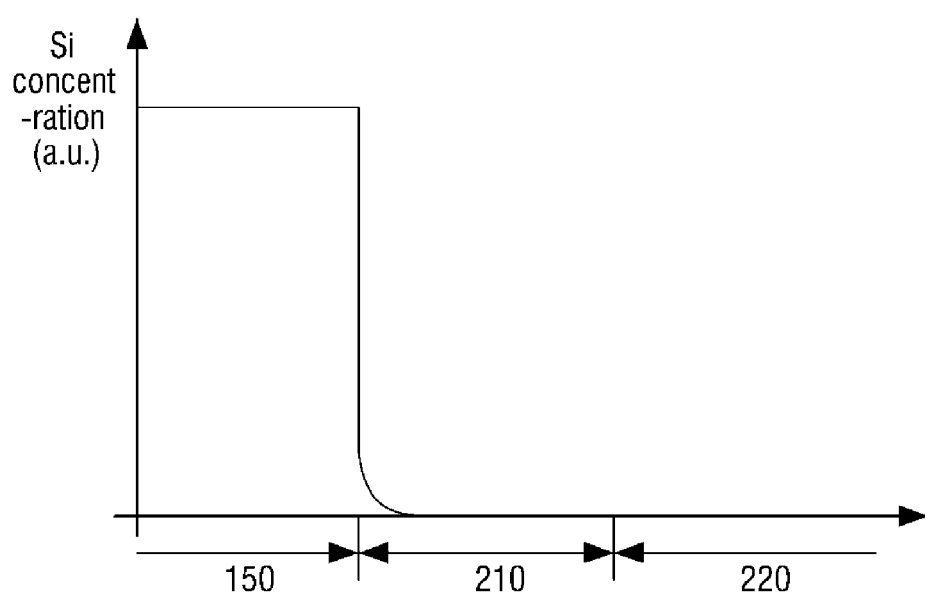
FIG. 9 is a schematic graph showing a concentration of silicon (Si) dopant along a line B of FIG. 2.

Each of FIGS. 7 and 8 is a schematic graph showing the concentration of the silicon (Si) dopant along a line A of FIG. 2. FIG. 9 is a schematic graph showing the concentration of a silicon (Si) dopant along a line B of FIG. 2.

Referring to FIG. 7, in the semiconductor device according to some embodiments, a part of the second_2 portion 210sp_22 of the side surface region 210sp of the outer part 210, and a part of the second_3 portion 210sp_23 of the side surface region 210sp of the outer part 210 may include a silicon (Si) dopant.

The second_2 portion 210sp_22 of the side surface region 210sp of the outer part 210 and the second_3 portion 210sp_23 of the side surface region 210sp of the outer part 210 include a region containing silicon (Si) dopant, and a region containing no silicon (Si) dopant.

A part of the second_2 portion 200ss_22 of the side wall 200ss of the lower electrode 200 and a part of the second_3 portion 200ss_23 of the side wall 200ss of the lower electrode 200 may include a silicon (Si) dopant.

Referring to FIGS. 8 and 9, each of the second_1 portion 210sp_21 of the side surface region 210sp of the outer part 210, the second_2 portion 210sp_22 of the side surface region 210sp of the outer part 210, and the second_3 portions 210sp_23 of the side surface region 210sp of the outer part 210 may generally include silicon (Si) dopant.

Each of the second_1 portion 200ss_21 of the side wall 200ss of the lower electrode 200, the second_2 portion 200ss_22 of the side wall 200ss of the lower electrode 200, and the second_3 portion 200ss_23 of the side wall 200ss may generally include silicon (Si) dopant. The silicon (Si) dopant may be doped along the entire second_2 portion 200ss_22 of the side wall 200ss of the lower electrode 200. The silicon (Si) dopant may be doped along the entire second_2 portion 200ss_22 of the side wall 200ss of the lower electrode 200. The silicon (Si) dopant may be doped along the entire second_3 portion 200ss_23 of the side wall 200ss of the lower electrode 200.

The silicon (Si) dopant contained in the second_1 portion 210sp_21 of the side surface region 210sp of the outer part 210 may be silicon diffused from the first portion 210sp_1 of the side surface region 210sp of the outer part 210 and/or the upper supporter pattern 150.

The silicon (Si) dopant contained in the second_2 portion 210sp_22 of the side surface region 210sp of the outer part 210 may be silicon diffused from the first portion 210sp_1 of the side surface region 210sp of the outer part 210 and/or the lower supporter pattern 140. The silicon (Si) dopant contained in the second_3 portion 210sp_23 of the side surface region 210sp of the outer part 210 may be silicon diffused from the first portion 210sp_1 of the side surface region 210sp of the outer part 210 and/or the etching stop film 130.

Figure 10:
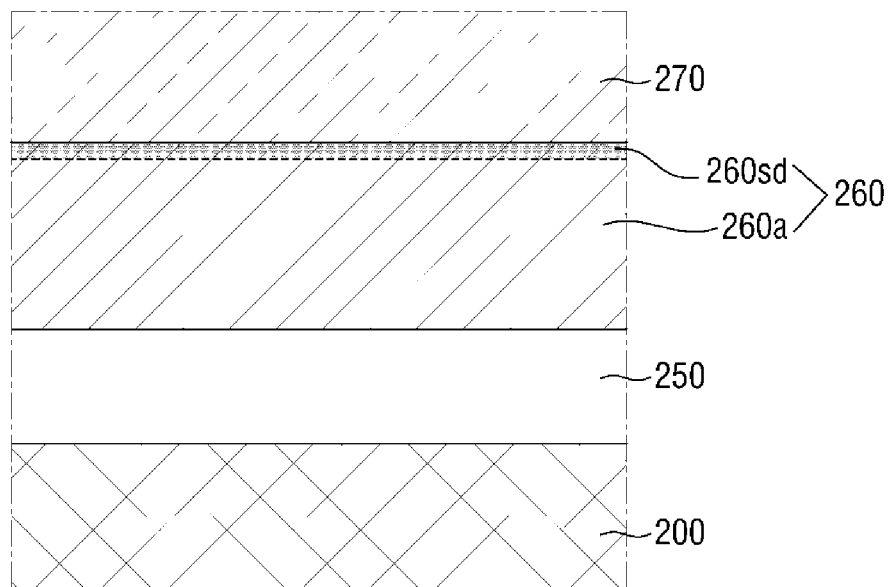
FIGS. 10 to 12 are diagrams for explaining the semiconductor device according to some embodiments of the present inventive concept, respectively.
Figure 11:
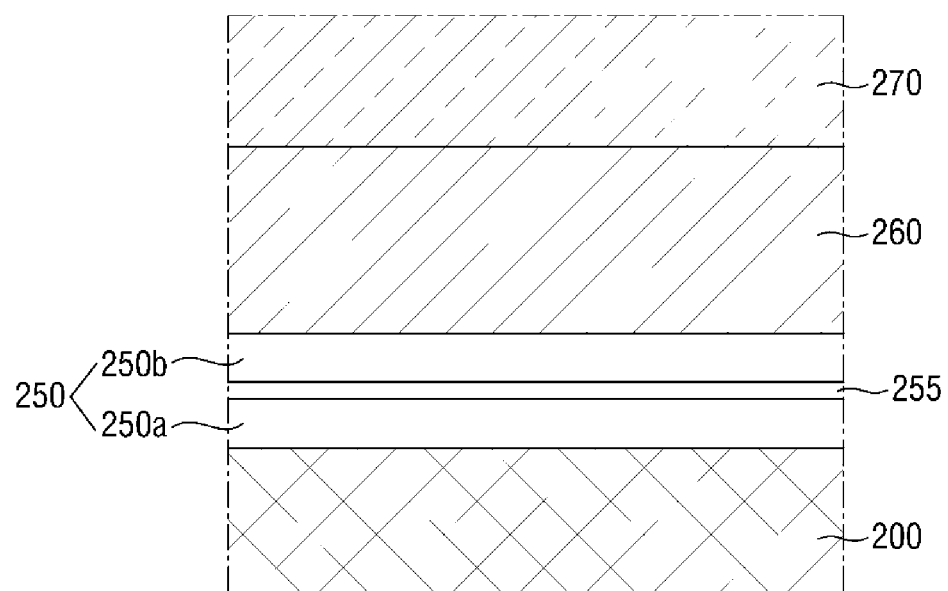
Figure 12:
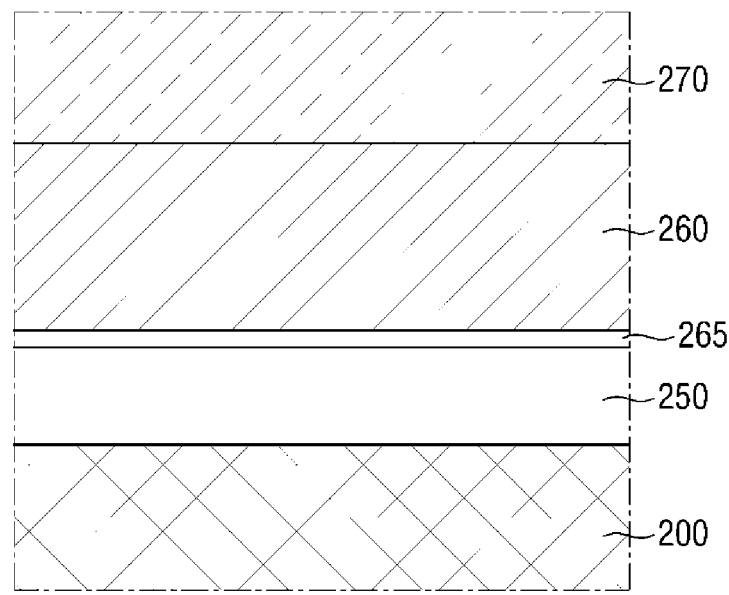

FIGS. 10 to 12 are diagrams for explaining the semiconductor device according to some embodiments of the present inventive concept. For convenience of explanation, the description may be focused on differences from those described using FIGS. 1 to 6.

For reference, each of FIGS. 10 to 12 is an enlarged view of a part P of FIG. 1.

Referring to FIG. 10, in the semiconductor device according to some embodiments, the upper electrode 260 may include an upper silicon doping region 260sd formed along a boundary with an upper plate electrode 270.

The upper electrode 260 may include a first region 260a not doped with silicon (Si), and an upper silicon doping region 260sd doped with silicon (Si). When the upper electrode 260 includes a TiN film, the upper silicon doping region 260sd may include a TiN or TiSiN film doped with silicon.

Referring to FIG. 11, the semiconductor device according to some embodiments may further include an insertion film 255 disposed between the lower electrode 200 and the upper electrode 260. The insertion film 255 may be disposed inside the capacitor dielectric film 250.

The insertion film 255 may promote crystallization of the capacitor dielectric film 250. The insertion film 255 allows the capacitor dielectric film 250 to be divided into a first portion 250a of the capacitor dielectric film and a second portion 250b of the capacitor dielectric film. The insertion film 255 may be in contact with the first portion 250a of the capacitor dielectric film and the second portion 250b of the capacitor dielectric film.

The insertion film 255 may include, for example, at least one of a nitride or an oxide of titanium (Ti), niobium (Nb), molybdenum (Mo) and tin (Sn). In some embodiments, the insertion film 255 may include at least one of ruthenium (Ru) and ruthenium oxide.

Referring to FIG. 12, the semiconductor device according to some embodiments may further include an upper protective film 265 disposed between the capacitor dielectric film 250 and the upper electrode 260.

The upper protective film 265 may reduce or prevent the oxygen atom included in the capacitor dielectric film 250 from moving to the upper electrode 260. The upper protective film 265 may include a metal oxide. The upper protective film 265 may include, for example, at least one of titanium oxide, tantalum oxide, molybdenum oxide, tin oxide, and niobium oxide.

Figure 13:
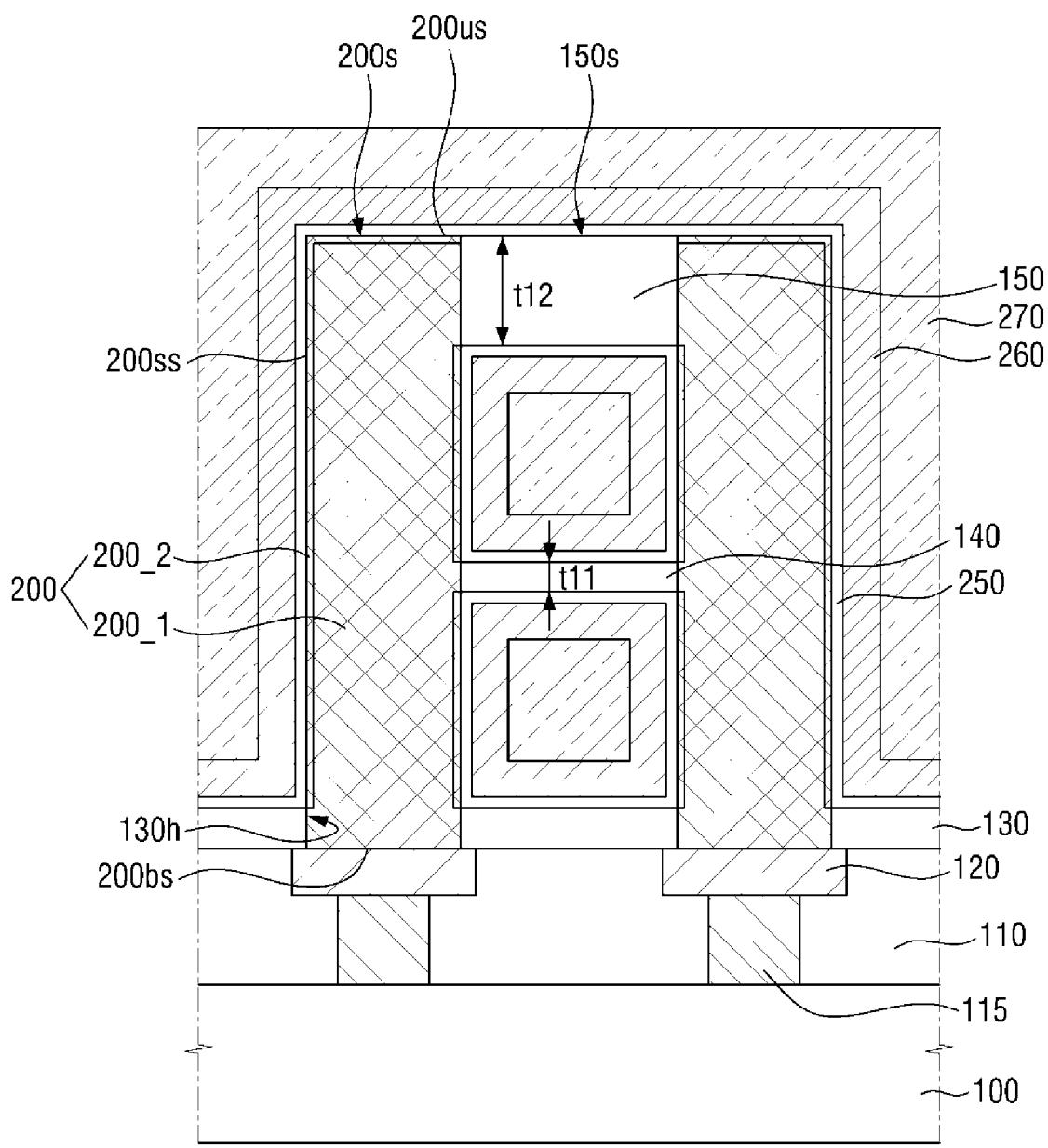
FIGS. 13 and 14 are diagrams for explaining the semiconductor device according to some embodiments of the present inventive concept, respectively.
Figure 14:
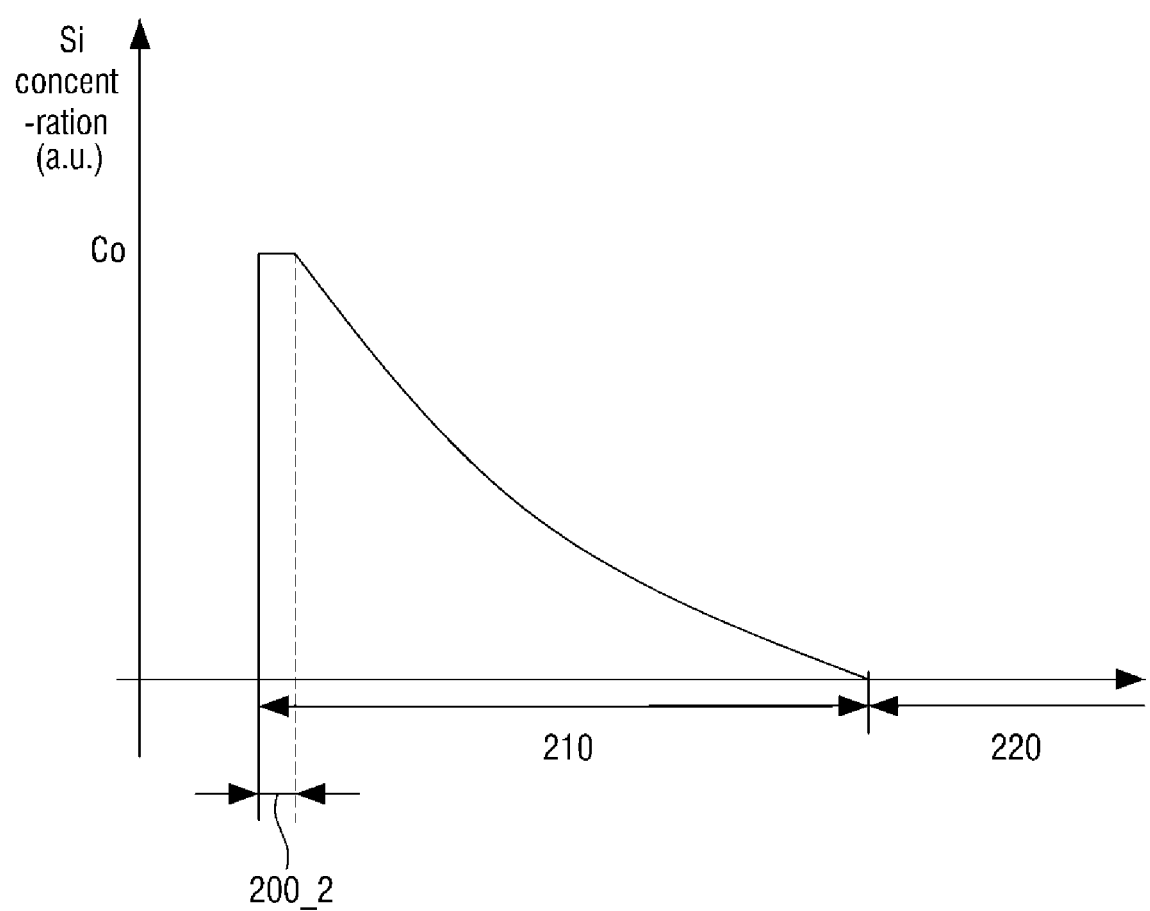

FIGS. 13 and 14 are diagrams for explaining the semiconductor device according to some embodiments of the present inventive concept. For convenience of explanation, the description may be focused on differences from those described using FIGS. 1 to 6. For reference, FIG. 14 is a schematic graph showing the concentration of a silicon (Si) dopant along a line C of FIG. 2.

Referring to FIGS. 2, 13, and 14, in the semiconductor device according to some embodiments, the lower electrode 200 may include a metal nitride film 200_1 and a metal silicon nitride film 200_2.

For example, the lower electrode 200 may include a metal nitride. The metal nitride film 200_1 of the lower electrode 200 may be a portion made up of metal nitride. The metal silicon nitride film 200_2 of the lower electrode 200 may be a portion in which the metal nitride film 200_1 is silicided. In some embodiments, the metal nitride film 200_1 may include a TiN film, and the metal silicon nitride film 200_2 may include a TiSiN film.

The outer part 210 of the lower electrode 200 may include a metal nitride film 200_1 and a metal silicon nitride film 200_2. The outer part 210 of the lower electrode 200 may include a portion that does not include the metal silicon nitride film 200_2.

The metal silicon nitride film 200_2 may extend along the first region of the outer part 210 of the lower electrode 200 in which the capacitor dielectric film 250 is formed. However, the metal silicon nitride film 200_2 is not formed in the second region of the outer part 210 of the lower electrode 200 in which the capacitor dielectric film 250 is not formed. The metal silicon nitride film 200_2 is not formed between the lower electrode 200 and the upper supporter pattern 150, between the lower electrode 200 and the lower supporter pattern 140, and between the lower electrode 200 and the etching stop film 130. For example, in the metal silicon nitride film 200_2, the concentration of silicon (Si) dopant may be kept constant. However, in the metal nitride film 200_1 in the first portion 210sp_1 of the side surface region 210sp of the outer part 210, the concentration of silicon (Si) dopant decreases as it goes away from the outer surface 200s of the lower electrode 200.

FIGS. 15 to 18 are diagrams for explaining the semiconductor device according to some embodiments of the present inventive concept. For convenience of explanation, the description may be focused on differences from those described using FIGS. 1 to 6.

Figure 15:
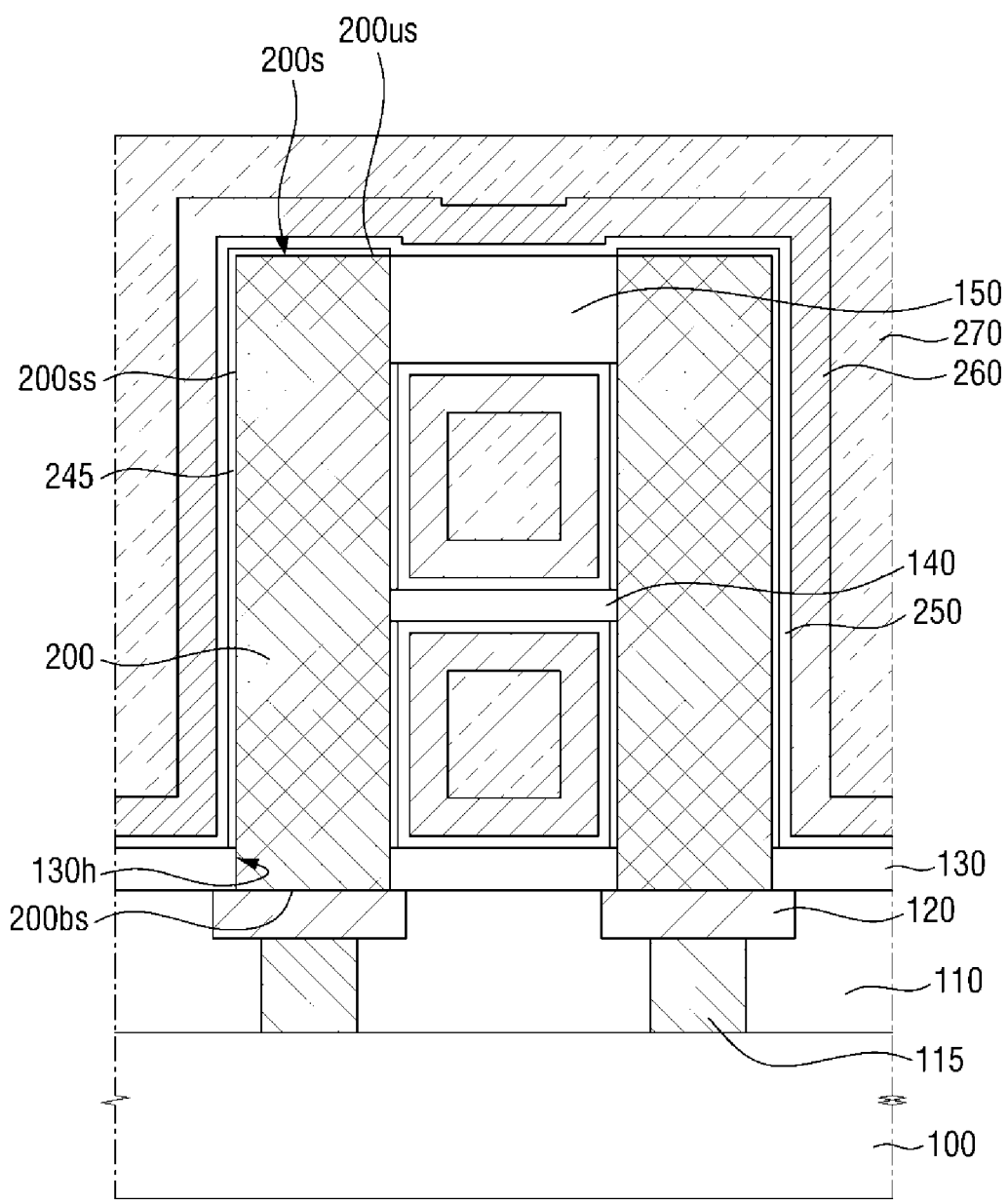
FIGS. 15 to 18 are diagrams for explaining the semiconductor device according to some embodiments of the present inventive concept, respectively.

Referring to FIG. 15, the semiconductor device according to some embodiments may further include a lower protective film 245 disposed between the capacitor dielectric film 250 and the lower electrode 200.

The lower protective film 245 may extend along a first region of the outer part 210 of the lower electrode 200 in which the capacitor dielectric film 250 is formed. The lower protective film 245 does not extend along the second region of the outer part 210 of the lower electrode 200 in which the capacitor dielectric film 250 is not formed. The lower protective film 245 is not formed between the lower electrode 200 and the upper supporter pattern 150, between the lower electrode 200 and the lower supporter pattern 140, and between the lower electrode 200 and the etching stop film 130. In addition, the lower protective film 245 does not extend along the outer surface of the lower supporter pattern 140, the outer surface of the upper supporter pattern 150 and the upper surface of the etching stop film 130.

The lower protective film 245 may reduce or prevent the oxygen atom contained in the capacitor dielectric film 250 from moving to the lower electrode 200. The lower protective film 245 may include, for example, a metal oxide. The lower protective film 245 may include, for example, at least one of a titanium oxide, a tantalum oxide, a molybdenum oxide, a tin oxide, and a niobium oxide.

Figure 16:
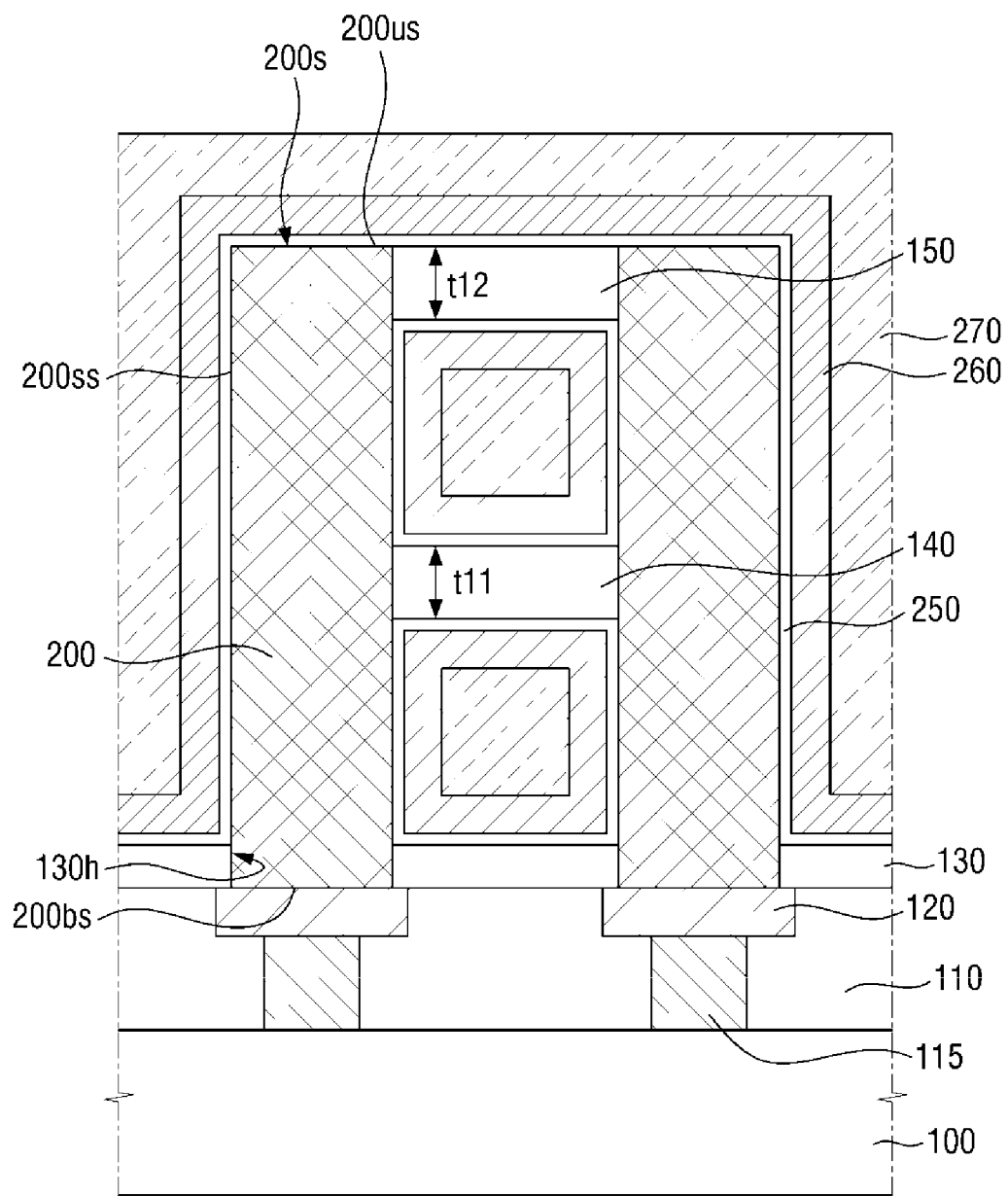

Referring to FIG. 16, in the semiconductor device according to some embodiments, the thickness t11 of the lower supporter pattern 140 in the second direction DR2 may be equal to the thickness t12 of the upper supporter pattern 150 in the second direction DR2.

Figure 17:
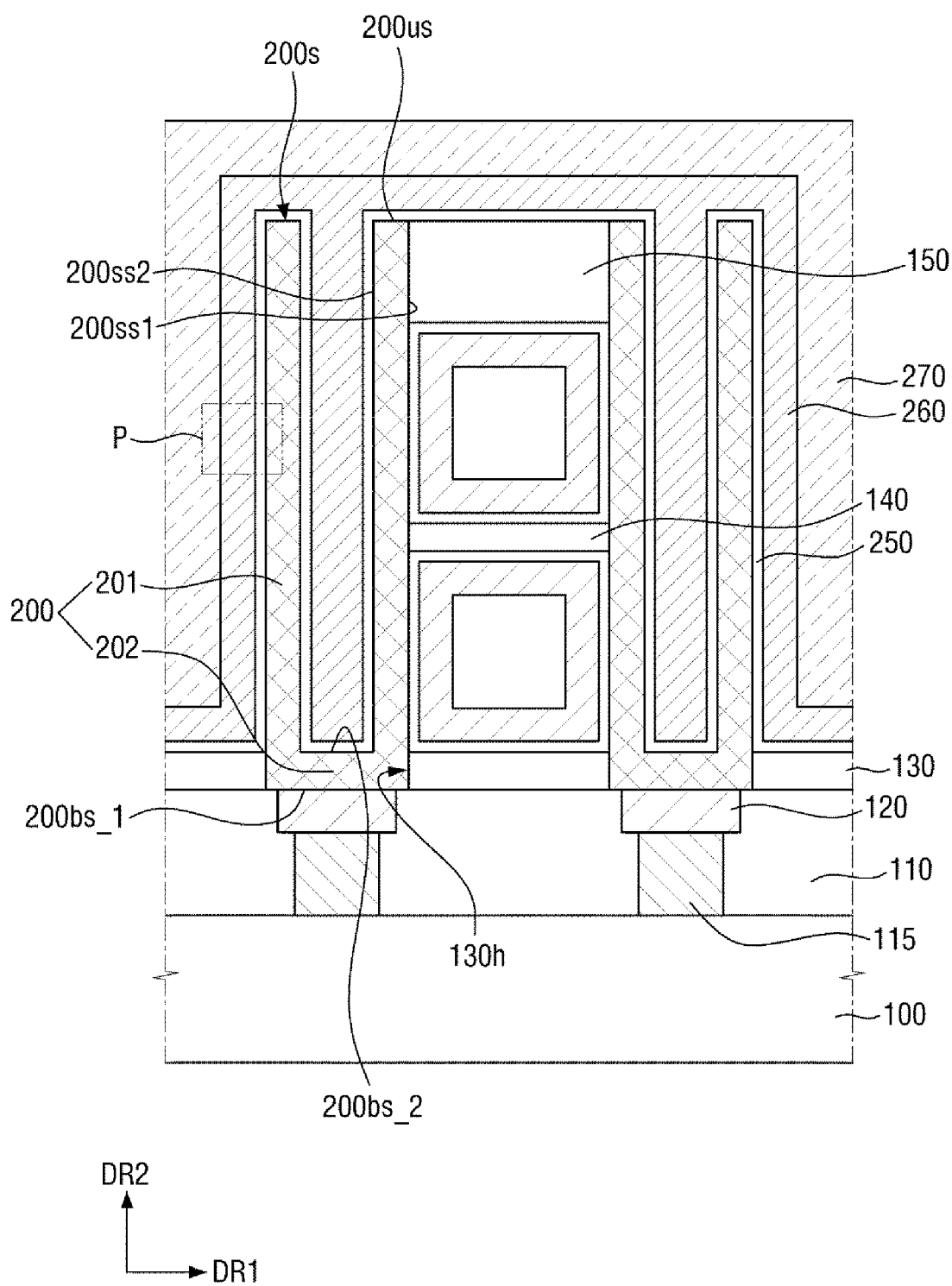

Referring to FIGS. 2 and 17, in the semiconductor device according to some embodiments, the lower electrode 200 may include a bottom part 202 extending along the upper surface of the first landing pad 120, and a side wall part 201 protruding from the bottom part 202. The side wall part 201 of the lower electrode 200 may extend in the second direction DR2.

The outer surface 200s of the lower electrode 200 may include a first side wall 200ss_1 of the lower electrode 200, and a second side wall 200ss_2 of the lower electrode 200. The outer surface 200s of the lower electrode 200 may include an upper surface 200us of the lower electrode 200 which connects the first side wall 200ss_1 of the lower electrode 200 and the second side wall 200ss_2 of the lower electrode 200. The outer surface 200s of the lower electrode 200 may include a first bottom surface 200bs_1 of the lower electrode 200 connected to the first side wall 200ss_1 of the lower electrode 200, and a second bottom surface 200bs_2 of the lower electrode 200 connected to the second side wall 200ss_2 of the lower electrode 200. The lower electrode 200 may have the shape of a barrel that contains items. The lower electrode 200 may have, for example, a cylinder shape.

The etching stop film 130, the lower supporter pattern 140 and the upper supporter pattern 150 may be in contact with the first side wall 200ss1 of the lower electrode 200. The capacitor dielectric film 250 may extend along the first side wall 200ss1 of the lower electrode 200 and the second side wall 200ss2 of the lower electrode 200. The bottom part 202 of the lower electrode 200 may include an outer part 210 of the lower electrode 200, and an inner part 220 of the lower electrode 200. The side wall part 201 of the lower electrode 200 may include the outer part 210 of the lower electrode 200 and the inner part 220 of the lower electrode 200.

For example, the ratio of the thickness of the outer part 210 of the lower electrode 200 to the width of the side wall part 201 of the lower electrode 200 in the first direction DR1 may be larger than 0 and smaller than 0.5. The width of the side wall part 201 of the lower electrode 200 in the first direction DR1 may be a distance between the first side wall 200ss1 of the lower electrode 200 and the second side wall 200ss2 of the lower electrode 200 opposing each other. In some embodiments, the width of the side wall part 201 of the lower electrode 200 in the first direction DR1 may be at most two times the thickness of the outer part 210 of the lower electrode 200 in the first direction DR1.

Figure 18:
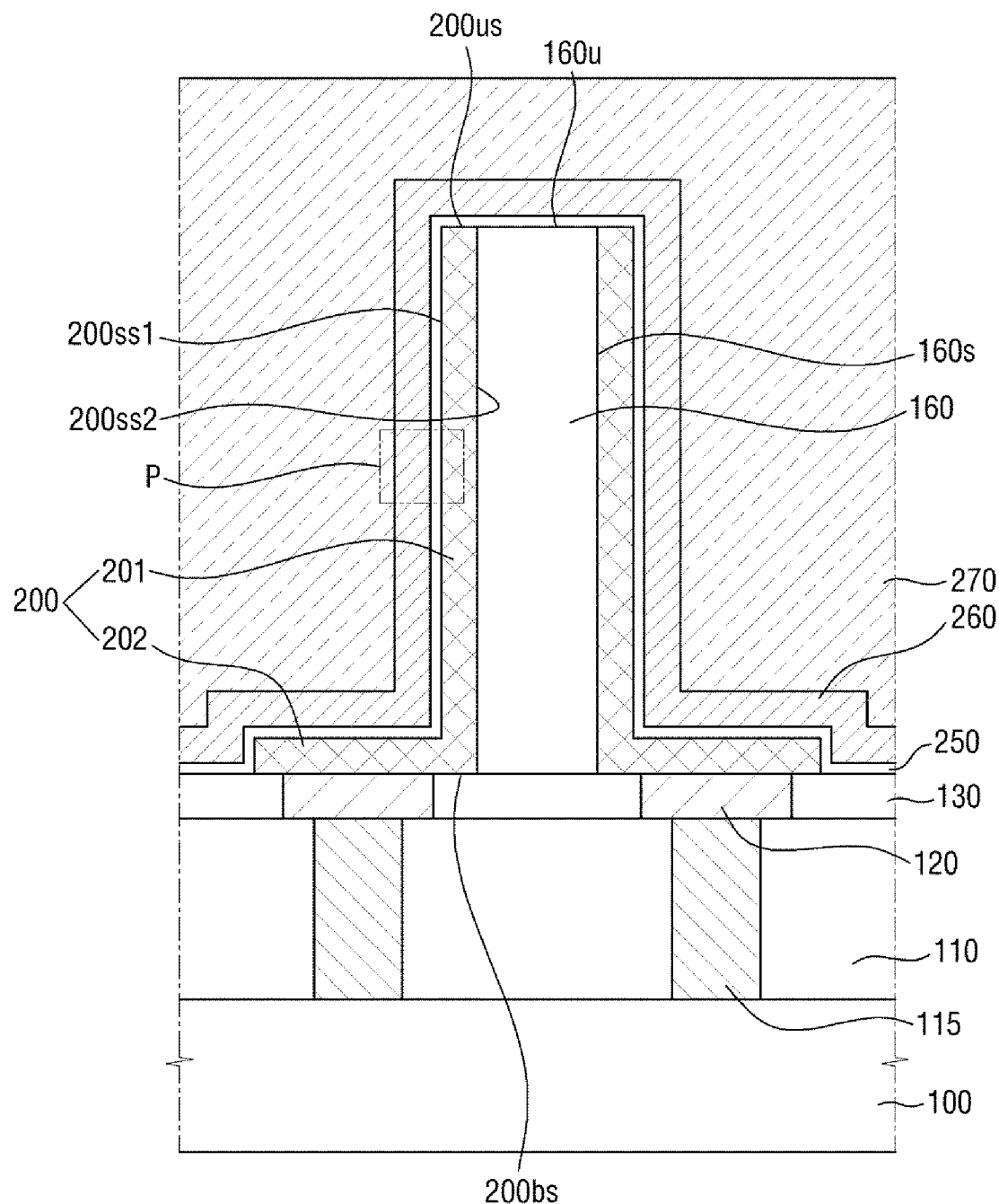

Referring to FIG. 18, the semiconductor device according to some embodiments of the present inventive concept may further include an insulating pattern 160 that is in contact with the lower electrode 200 and extends in the second direction DR2n.

The insulating pattern 160 may be disposed on the etching stop film 130. The insulating pattern 160 may include a side wall 160s and an upper surface 160u. The first landing pad 120 may be disposed in the etching stop film 130. The lower electrode 200 may be disposed on the etching stop film 130. The lower electrode 200 may include a bottom part 202 extending along the upper surface of the first landing pad 120, and a side wall part 201 protruding from the bottom part 202. The side wall part 202 of the lower electrode 200 may extend in the second direction DR2. The side wall part 202 of the lower electrode 200 may extend along the side wall 160s of the insulating pattern 160. For example, the lower electrode 200 may have an L-shape.

The outer surface of the lower electrode 200 may include a first side wall 200ss1 of the lower electrode 200, and a second side wall 200ss2 of the lower electrode 200. The second side wall 200ss2 of the lower electrode 200 may face the side wall 160s of the insulating pattern 160. The outer surface of the lower electrode 200 may include an upper surface 200us of the lower electrode 200 that connects the first side wall 200ss1 of the lower electrode 200 and the second side wall 200ss2 of the lower electrode 200. The outer surface of the lower electrode 200 may include a bottom surface 200bs of the lower electrode 200 which is connected to the second side wall 200ss2 of the lower electrode 200 and faces the upper surface 130s of the etching stop film and the upper surface of the first landing pad 120.

The capacitor dielectric film 250 may extend along the first side wall 200ss1 of the lower electrode 200. However, the capacitor dielectric film 250 does not extend along the second side wall 200ss2 of the lower electrode 200. The capacitor dielectric film 250 is not disposed between the second side wall 200ss2 of the lower electrode 200 and the side wall 160s of the insulating pattern 160. The capacitor dielectric film 250 extends along the upper surface 160u of the insulating pattern 160.

For example, the ratio of the thickness of the outer part 210 of the lower electrode 200 to the width of the side wall part 201 of the lower electrode 200 in the first direction DR1 may be larger than 0 and smaller than 0.5. In some embodiments, the width of the side wall part 201 of the lower electrode 200 in the first direction DR1 may be at most two times of the thickness of the outer part 210 of the lower electrode 200 in the first direction DR1.

In the semiconductor device according to some embodiments, the concentration of the silicon (Si) dopant on the first side wall 200ss1 of the lower electrode 200 is smaller than the concentration of the silicon (Si) dopant on the second side wall 200ss2 of the lower electrode 200. The second side wall 200ss2 of the lower electrode 200 includes a region doped with a silicon (Si) dopant, and a region not doped with a silicon (Si) dopant.

Figure 19:
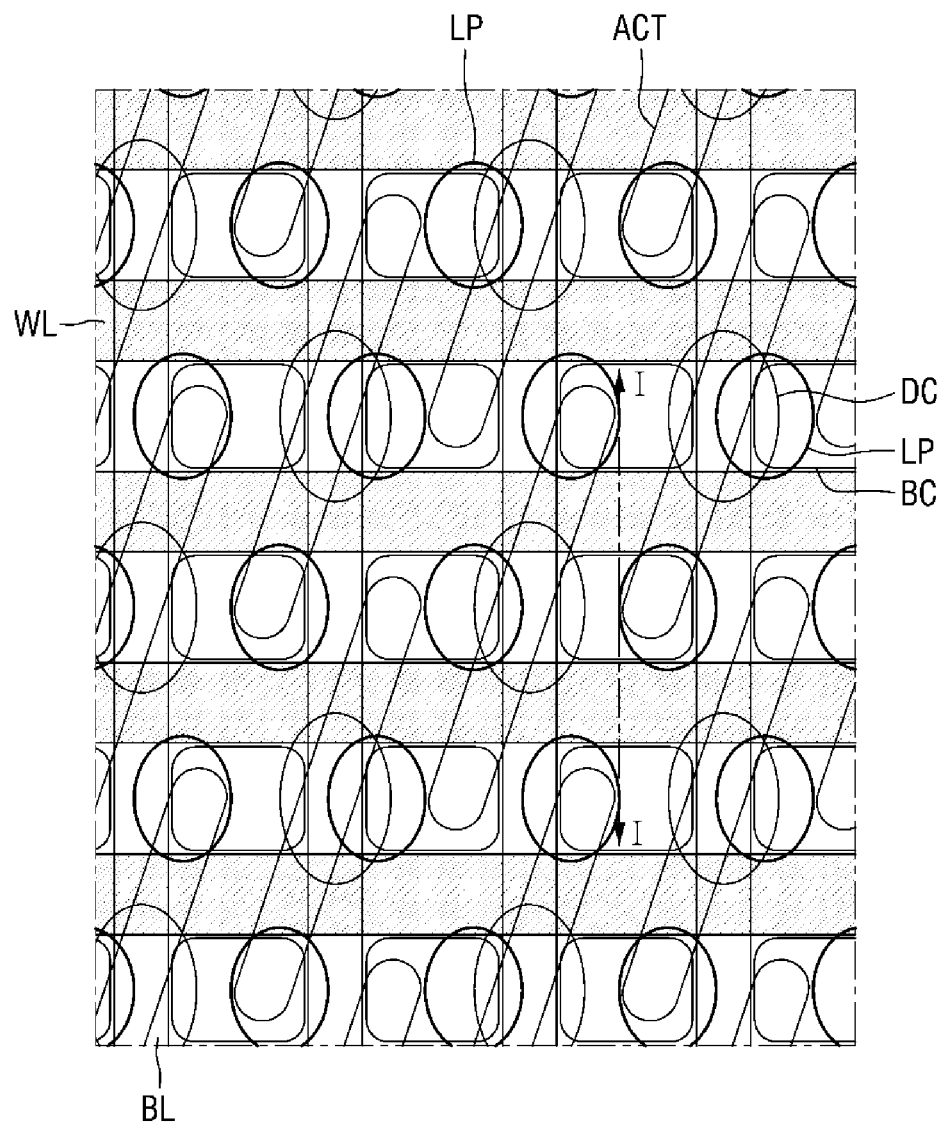
FIG. 19 is a schematic layout diagram for explaining the semiconductor device according to some embodiments of the present inventive concept.
Figure 20:
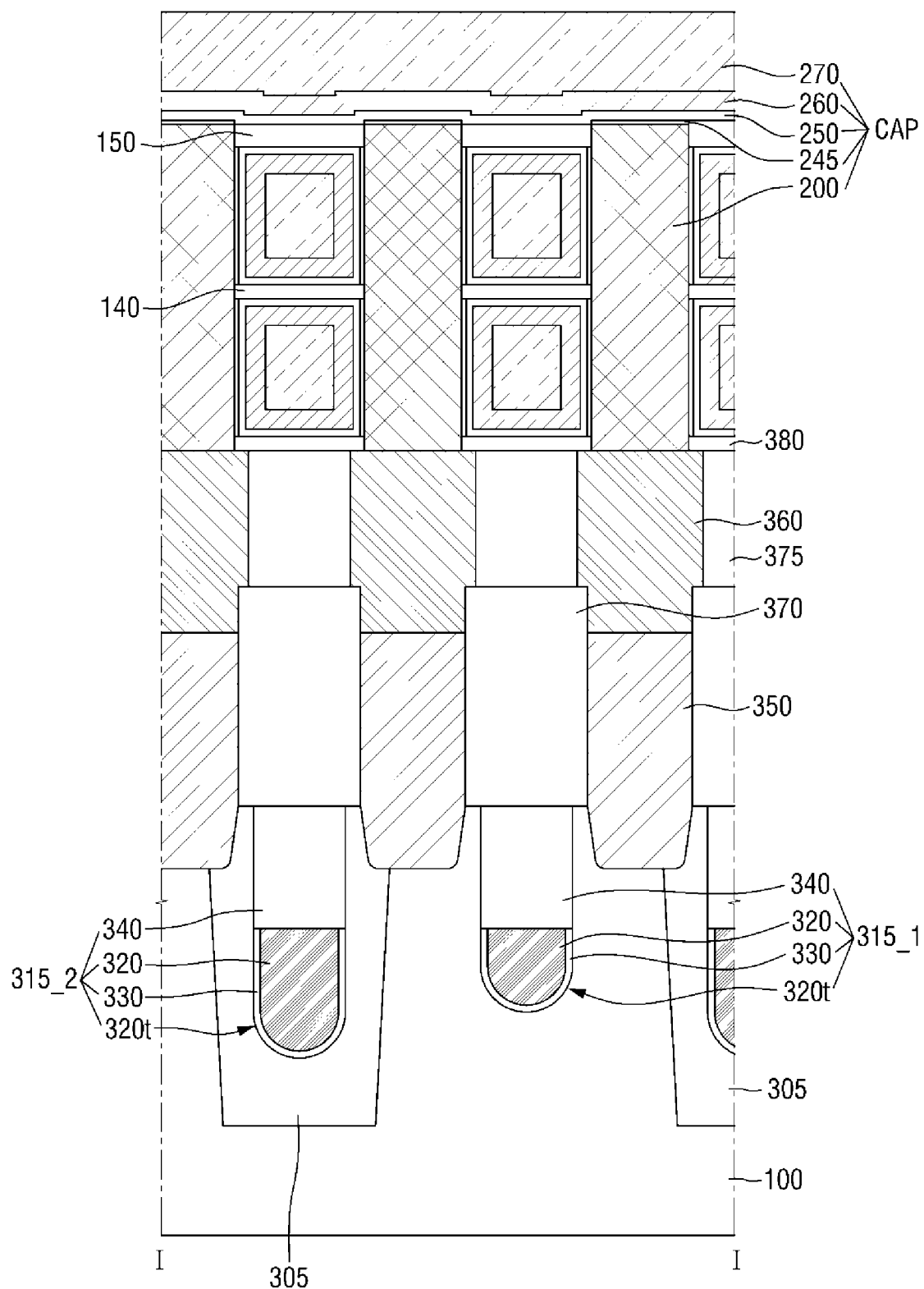
FIG. 20 is a cross-sectional view taken along a line I-I of FIG. 19.

FIG. 19 is a schematic layout diagram for explaining the semiconductor device according to some embodiments of the present inventive concept. FIG. 20 is a cross-sectional view taken along a line I-I of FIG. 19. For reference, FIG. 19 shows a layout diagram of a dynamic random access memory (DRAM), which does not show the capacitor CAP, but the layout is not limited thereto. Further, the fourth direction DR4 of FIG. 19 may correspond to the first direction DR1 of FIG. 1.

Referring to FIG. 19, the semiconductor device according to some embodiments may include a plurality of active regions ACT. The active region ACT may be defined by an element isolation film (305 of FIG. 20) formed in the substrate (100 of FIG. 20).

With a decrease in the design rule of the semiconductor device, the active regions ACT may be arranged in a bar shape of a diagonal line or an oblique line as shown. The active region ACT may have a bar shape extending in a fifth direction D5.

A plurality of gate electrodes may be disposed on the active region ACT in a third direction DR3 across the active region ACT. The plurality of gate electrodes may extend in parallel with each other. The plurality of gate electrodes may be, for example, a plurality of word lines WL. The word lines WL may be arranged at equal intervals. A width of the word line WL or an interval between the word lines WL may be determined depending on the design rules. A plurality of bit lines BL extending in a fourth direction DR4 perpendicular to the word line WL may be arranged on the word line WL. The plurality of bit lines BL may extend in parallel with each other. The bit lines BL may be arranged at regular intervals. A width of the bit line BL or an interval between the bit lines BL may be determined depending on the design rules.

The semiconductor device according to some embodiments may include various contact arrangements formed on the active region ACT. Various contact arrangements may include, for example, a direct contact DC, a buried contact BC, a landing pad LP and the like. Here, the direct contact DC may mean a contact that electrically connects the active region ACT to the bit line BL. The buried contact BC may mean a contact that connects the active region ACT to the lower electrode (200 of FIG. 20) of the capacitor (CAP of FIG. 20). In view of the layout structure, a contact area between the buried contact BC and the active region ACT may be small. Accordingly, in order to increase the contact area with the lower electrode (200 of FIG. 20) of the capacitor together with the increase in the contact area with the active region ACT, a conductive second landing pad LP may be introduced.

The second landing pad LP may be disposed between the active region ACT and the buried contact BC, and may be disposed between the buried contact BC and the lower electrode of the capacitor. In the semiconductor device according to some embodiments, the second landing pad LP may be disposed between the buried contact BC and the lower electrode of the capacitor. By increasing the contact area through introduction of the second landing pad LP, contact resistance between the active region ACT and the capacitor lower electrode may be reduced.

In the semiconductor device according to some embodiments, a direct contact DC may be disposed in a central portion of the active region ACT. The buried contacts BC may be disposed at both ends of the active region ACT. As the buried contacts BC are disposed at both ends of the active region ACT, the second landing pad LP may be disposed to partially overlap the buried contact BC to be adjacent to both ends of the active region ACT. In other words, the buried contact BC may be formed to overlap the active region ACT and the element isolation film (305 of FIG. 20) located between the adjacent word lines WL and the adjacent bit lines BL.

The word line WL may be formed as a structure buried in the substrate 100. The word line WL may be arranged across the active region ACT between the direct contact DC and the buried contact BC. As shown, two word lines WL may be disposed to cross one active region ACT. Since the active regions ACT are disposed in the form of an oblique line, the word lines WL may have an angle of less than 90 degrees with the active region ACT. The direct contact DC and the buried contact BC may be disposed symmetrically. Therefore, the direct contact DC and the buried contact BC may be disposed on a straight line along the third direction DR3 and the fourth direction DR4.

On the other hand, unlike the direct contact DC and the buried contact BC, the second landing pad LP may be disposed in a zigzag manner in the fourth direction DR4 in which the bit line BL extends. Further, the second landing pad LP may be disposed to overlap the same side surface parts of each bit line BL in the third direction DR3 in which the word line WL extends. For example, each of the second landing pads LP on the first line may overlap the left side surface of the corresponding bit line BL, and each of the second landing pads LP on the second line may overlap the right side surface of the corresponding bit line BL.

Referring to FIGS. 19 and 20, the semiconductor device according to some embodiments may include gate structures 315_1 and 315_2, a second storage contact 350, a storage pad 360, and a capacitor CAP.

The element isolation film 305 may be formed in the substrate 100. The element isolation film 305 may have an STI (shallow trench isolation) structure having excellent element isolation characteristics. The element isolation film 305 may define an active region ACT on the substrate 100. The active region ACT defined by the element isolation film 305 may have a long island shape including a long axis and a short axis as shown in FIG. 19. The active region ACT may have an oblique line form to have an angle of less than 90 degrees with respect to the word line WL formed in the element isolation film 305. Further, the active region ACT may have an oblique line form to have an angle of less than 90 degrees with respect to the bit line BL formed on the element isolation film 305. That is, the active region ACT may extend in the fifth direction DR5 having a predetermined angle in the third direction DR3 and the fourth direction DR4.

The gate structures 315_1 and 315_2 may be formed in the substrate 100 and the element isolation film 305. The gate structures 315_1 and 315_2 may be formed across the active region ACT defined by the element isolation film 305 and the element isolation film 305. The gate structures 315_1 and 315_2 include a gate structure 315_1 in the active region ACT of the substrate 100, and a gate structure 315_2 in the element isolation film 305.

The gate structures 315_1 and 315_2 may include a buried gate trench 320t, a gate insulating film 330, a gate electrode 320, and a gate block pattern 340 formed in the substrate 100 and the element isolation film 305. The gate electrode 320 may correspond to the word line WL. For example, the depth of the buried gate trench 320t formed in the substrate 100 may be different from the depth of the buried gate trench 320t formed in the element isolation film 305. The gate insulating film 330 may extend along the side walls and the bottom surface of the buried gate trench 320t. The gate insulating film 330 may extend along a profile of at least a part of the buried gate trench 320t. The gate insulating film 330 may include, for example, at least one of silicon oxide, silicon oxynitride, silicon nitride, or a high dielectric constant material having a dielectric constant higher than silicon oxide.

The gate electrode 320 may be formed on the gate insulating film 330. The gate electrode 320 may fill a part of the buried gate trench 320t. The gate electrode 320 may include at least one of a semiconductor material doped with an impurity, a conductive silicide compound, a conductive metal nitride, a conductive metal oxide, a conductive metal oxynitride, and a metal.

The gate block pattern 340 may be formed on the gate electrode 320. The gate block pattern 340 may fill the remaining buried gate trench 320t in which the gate electrode 320 is formed. The gate block pattern 340 may include, for example, at least one of silicon nitride (SiN), silicon oxynitride (SiON), silicon oxide (SiO2), silicon carbonitride (SiCN), silicon oxycarbonitride (SiOCN), and combinations thereof.

The second lower interlayer insulating film 370 may be disposed on the substrate 100 and the element isolation film 305. The second lower interlayer insulating film 370 may cover the gate structures 315_1 and 315_2. A second storage contact 350 may be formed in the second lower interlayer insulating film 370. The second storage contact 350 may be connected to the substrate 100. More specifically, the second storage contact 350 may be connected to a source/drain region formed in the active region ACT of the substrate 100. The second storage contact 350 may be disposed on at least one side of the gate structures 315_1 and 315_2. For example, the second storage contact 350 may be arranged on both sides of the gate structures 315_1 and 315_2. The second storage contact 350 may correspond to the buried contact BC. Further, the second storage contact 350 may correspond to the first storage contact 115 of FIGS. 1 to 18.

The storage pad 360 may be formed on the second storage contact 350. The storage pad 360 may be electrically connected to the second storage contact 350. Here, the storage pad 360 may correspond to the second landing pad LP. In addition, the storage pad 360 may correspond to the first landing pad 120 of FIGS. 1 to 14.

The second upper interlayer insulating film 375 may be formed on the second lower interlayer insulating film 370. The second upper interlayer insulating film 375 may wrap (e.g., enclose) the storage pad 360. The second upper interlayer insulating film 375 and the second lower interlayer insulating film 370 may correspond to the first interlayer insulating film 110 of FIGS. 1 to 17. The lower electrode etching stop film 380 may be formed on the second upper interlayer insulating film 375 and the storage pad 360. The lower electrode etching stop film 380 may correspond to the etching stop film 130 of FIGS. 1 to 18.

The capacitor CAP may be located on the storage pad 360. The capacitor CAP may be connected to the storage pad 360. That is, the capacitor CAP may be electrically connected to the second storage contact 350.

The capacitor CAP may include a lower electrode 200, a lower protective film 245, a capacitor dielectric film 250, an upper electrode 260, and an upper plate electrode 270. The lower supporter pattern 140 and the upper supporter pattern 150 may be formed on the lower electrode etching stop film 380. Explanation of the lower electrode 200, the capacitor dielectric film 250, the upper electrode 260, and the upper plate electrode 270 included in the capacitor CAP may be substantially the same as the explanation provided using FIGS. 1 to 18.

FIGS. 21 to 25 are diagrams illustrating a method for fabricating a semiconductor device according to some embodiments.

Figure 21:
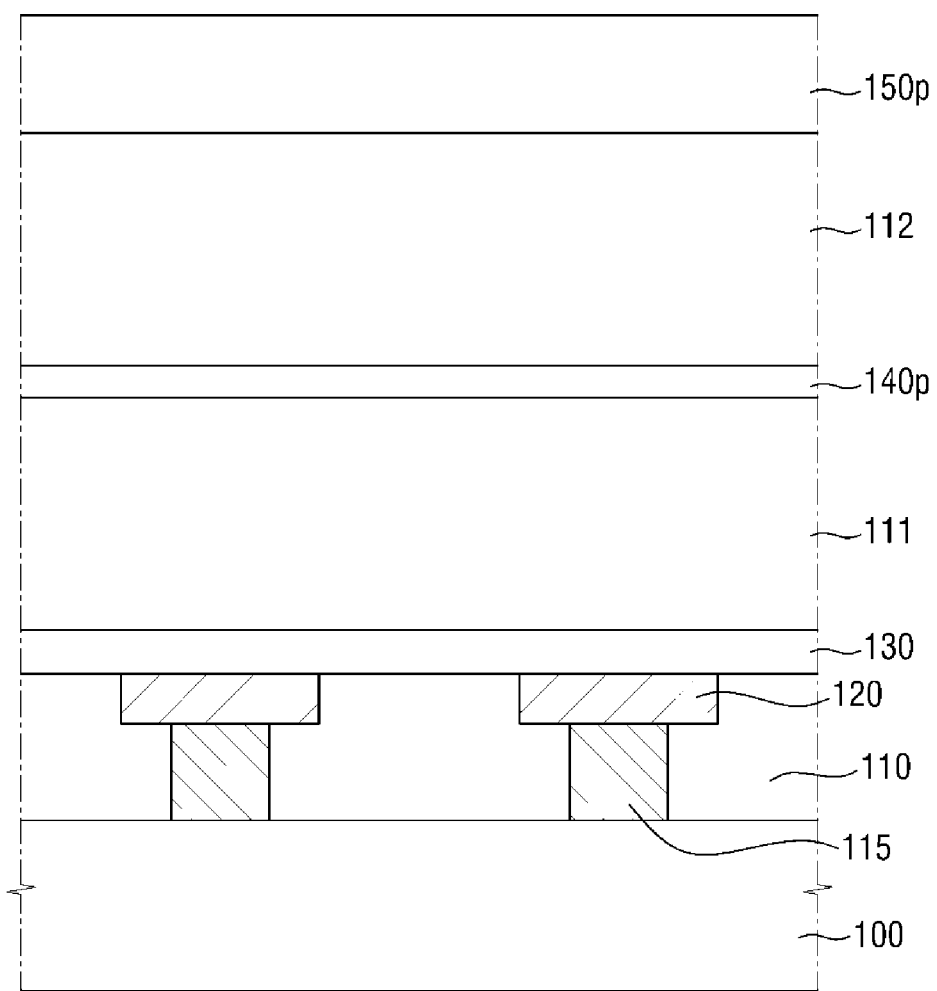
FIGS. 21 to 25 are diagrams illustrating a method for fabricating a semiconductor device according to some embodiments of the present inventive concept.

Referring to FIG. 21, a first storage contact 115 and a first landing pad 120 may be formed in the first interlayer insulating film 110 on the substrate 100. An etching stop film 130, a lower mold film 111, a lower supporter film 140p, an upper mold film 112, and an upper supporter film 150p may be sequentially formed on the first interlayer insulating film 110.

Figure 22:
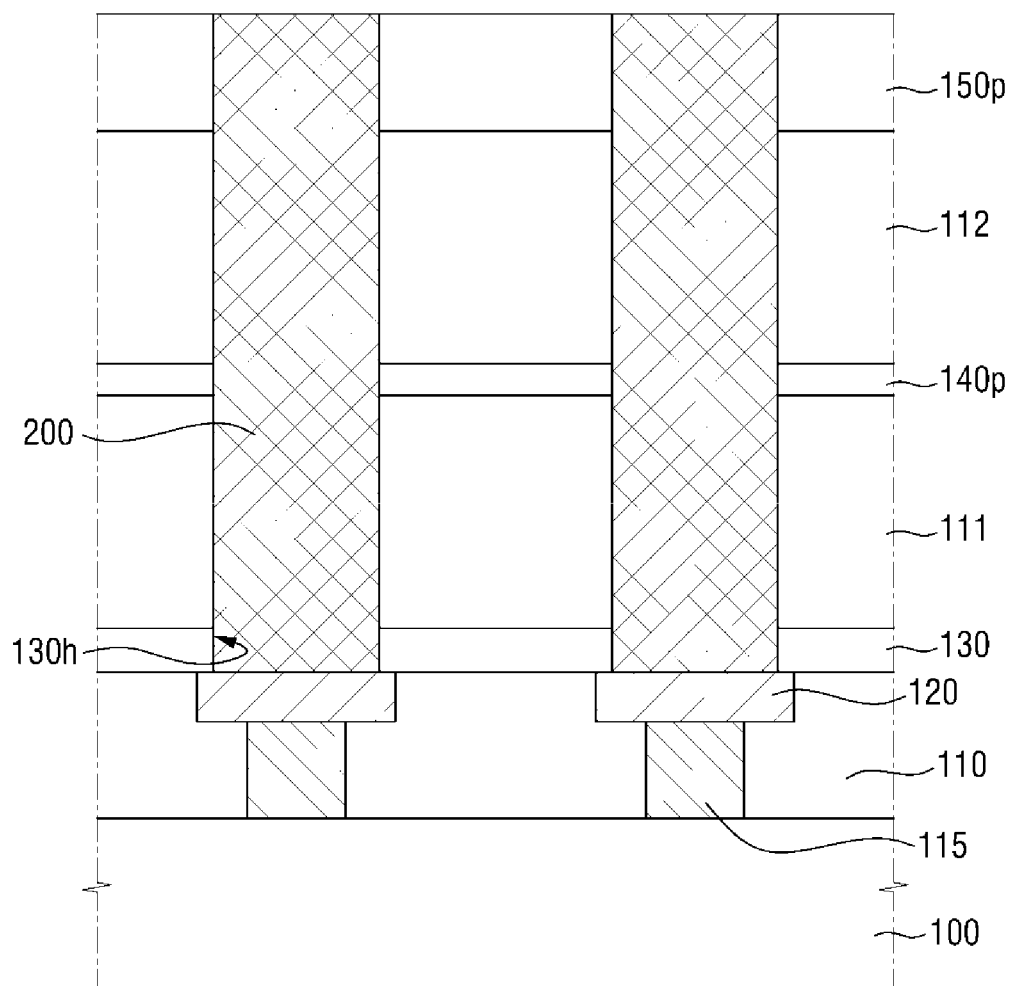

Referring to FIG. 22, a lower electrode 200 which penetrates the etching stop film 130, the lower mold film 111, the lower supporter film 140p, the upper mold film 112, and the upper supporter film 150p may be formed on the first landing pad 120. A part of the lower electrode 200 may be disposed in a lower electrode hole 130h included in the etching stop film 130.

Figure 23:
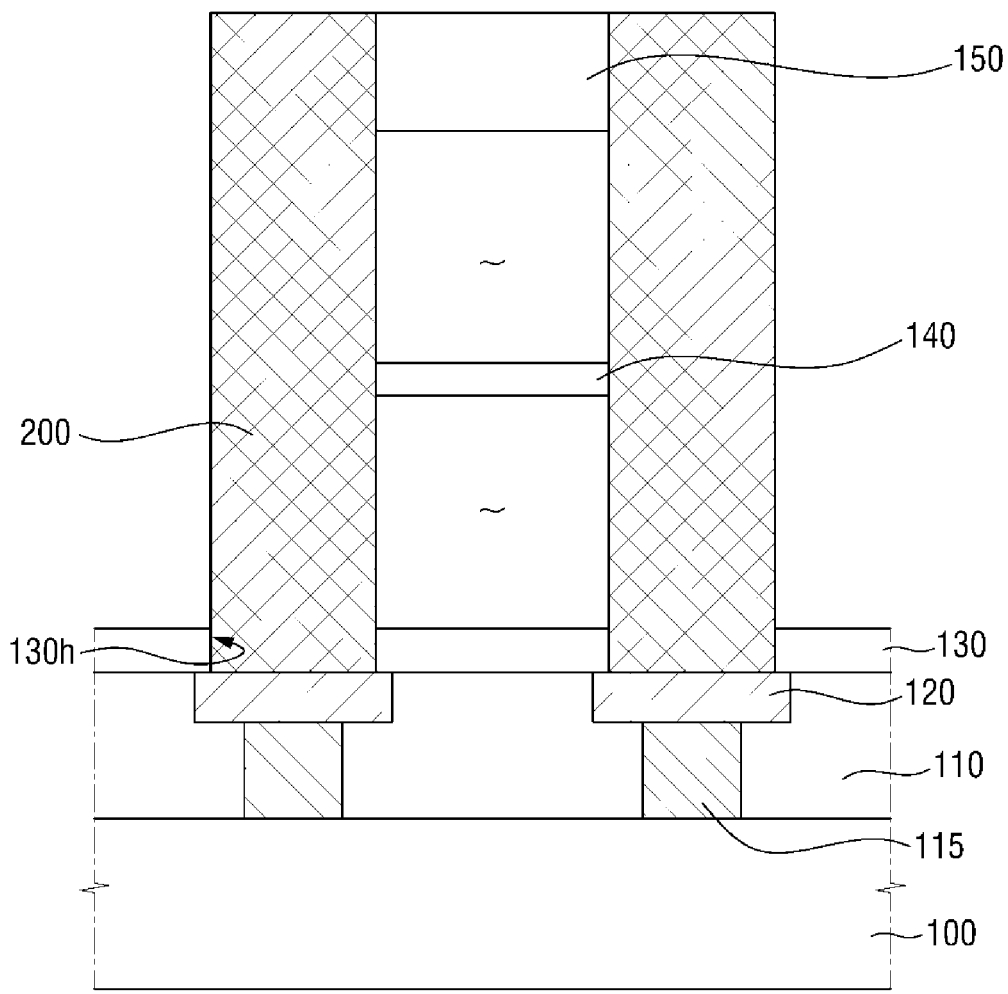

Referring to FIG. 23, an upper supporter pattern 150 and a lower supporter pattern 140 which connect adjacent lower electrodes 200 may be formed. Each of the upper supporter pattern 150 and the lower supporter pattern 140 may be in contact with a part of the side wall of the lower electrode 200.

The upper supporter pattern 150 may be formed by removing a part of the upper supporter film 150p. The upper mold film 112 may be removed through a region in which the upper supporter pattern 150 is not formed. Subsequently, the lower supporter pattern 140 may be formed by removing a part of the lower supporter film 140p. The lower mold film 111 may be removed through a region in which the lower supporter pattern 140 is not formed. Accordingly, a space may be formed between the upper supporter pattern 150 and the lower supporter pattern 140, and between the lower supporter pattern 140 and the etching stop film 130.

Figure 24:
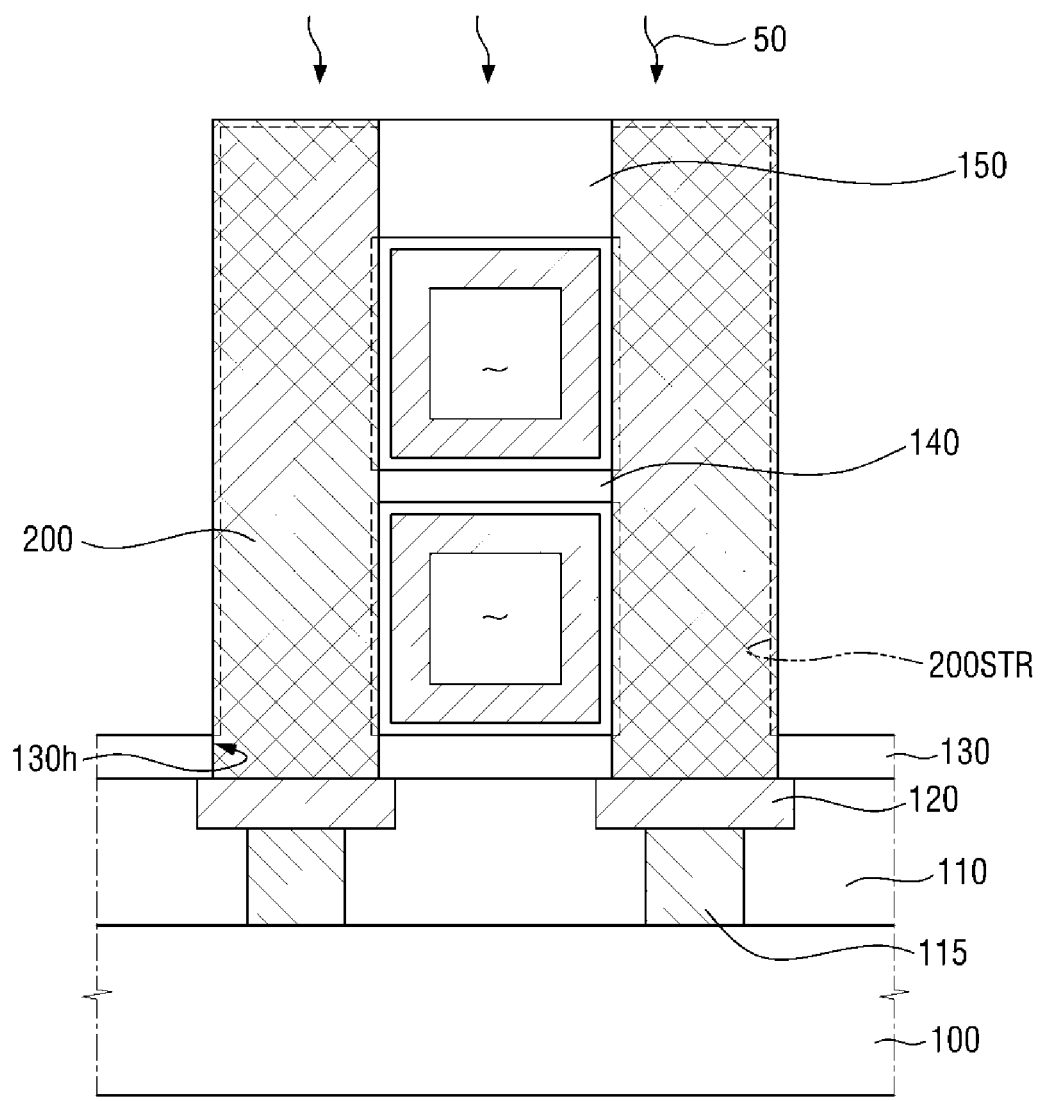

Referring to FIG. 24, a silicon processing region 200STR may be formed in the lower electrode 200 using a surface treatment process 50. In the surface treatment process 50, for example, a precursor containing silicon may be used.

The silicon processing region 200STR may be formed on the outer surface of the lower electrode 200 that is not covered by the upper supporter pattern 150, the lower supporter pattern 140, and the etching stop film 130.

If the surface treatment process 50 takes a long time unlike the shown example, the silicon processing region 200STR may be, for example, a metal silicon nitride film.

Figure 25:
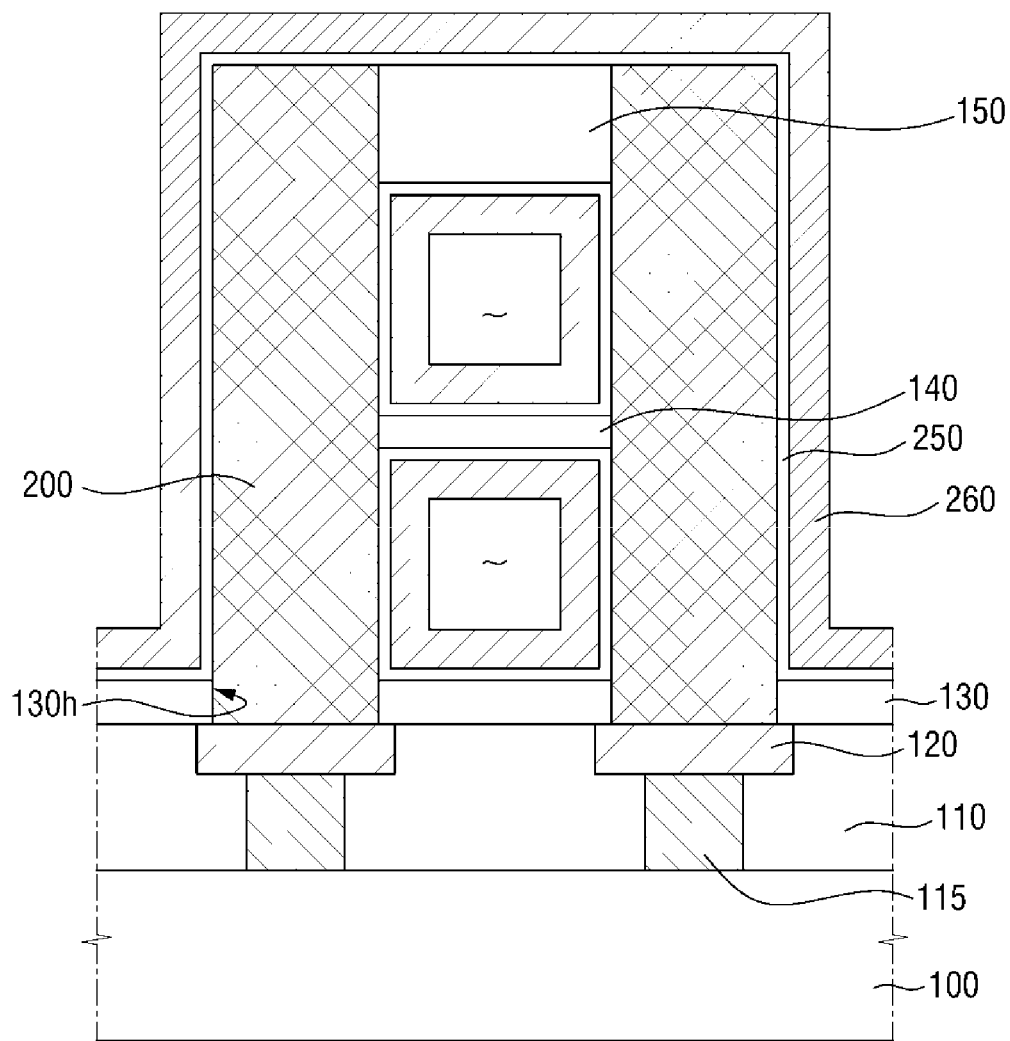

Referring to FIG. 25, the capacitor dielectric film 250 may be formed along the profile of the lower electrode 200, the profile of the upper supporter pattern 150, the profile of the lower supporter pattern 140 and the upper surface of the etching stop film 130.

An upper electrode 260 may be formed on the capacitor dielectric film 250.

In concluding the detailed description, those skilled in the art will appreciate that many variations and modifications may be made to the example embodiments described herein without substantially departing from the principles of the present disclosure. Therefore, the example embodiments described herein should be considered as generic and descriptive only and not for purposes of limitation.

What is claimed is:
1. A semiconductor device comprising:
a landing pad on a substrate;
a lower electrode on the landing pad and connected to the landing pad, wherein the lower electrode includes an outer portion and an inner portion enclosed by the outer portion, and the outer portion includes a first region and a second region;

a dielectric film extending along the first region of the outer portion of the lower electrode; and
an upper electrode on the dielectric film,
wherein the first region of the outer portion of the lower electrode includes a silicon (Si) dopant,
the dielectric film does not extend along the second region of the outer portion of the lower electrode,
a concentration of the silicon dopant in the first region of the outer portion is different from a concentration of the silicon dopant in the second region of the outer portion, and
the concentration of the silicon dopant in the first region in the outer portion is higher than a concentration of the silicon dopant in the inner portion.

2. The semiconductor device of claim 1, wherein the concentration of the silicon dopant in the first region of the outer portion is higher than the concentration of the silicon dopant in the second region of the outer portion.

3. The semiconductor device of claim 1, wherein the inner portion of the lower electrode is devoid of the silicon dopant.

4. The semiconductor device of claim 1, further comprising:
an insertion film between the lower electrode and the dielectric film,
the insertion film extending along the first region of the outer portion and not extending along the second region of the outer portion.

5. The semiconductor device of claim 1, wherein the lower electrode includes a metal silicon nitride film extending along the first region of the outer portion.

6. The semiconductor device of claim 5, wherein the metal silicon nitride film does not extend on the second region of the outer portion.

7. The semiconductor device of claim 1, further comprising:
a supporter pattern that is on the substrate and contacts the second region of the outer portion.

8. The semiconductor device of claim 1, further comprising:
an upper plate electrode on the upper electrode,
the upper electrode including a silicon doped region along an interface with the upper plate electrode.

9. The semiconductor device of claim 1, wherein the outer portion includes a side surface region including a side wall of the lower electrode, and an upper surface region including an upper surface of the lower electrode, and
the side surface region of the outer portion includes the first region of the outer portion and the second region of the outer portion.

10. The semiconductor device of claim 1, wherein the lower electrode has a pillar shape extending in a thickness direction of the substrate.

11. The semiconductor device of claim 1, wherein the lower electrode has a cylinder shape.

12. A semiconductor device comprising:
a landing pad on a substrate;
a lower electrode on the landing pad and connected to the landing pad, wherein the lower electrode extends in a thickness direction of the substrate;
a supporter pattern being in contact with a portion of the lower electrode;
a dielectric film extending along an outer surface of the lower electrode and an outer surface of the supporter pattern; and
an upper electrode on the dielectric film,
wherein the lower electrode includes a first region that is adjacent to the dielectric film and includes a silicon (Si) dopant and a second region adjacent to the supporter pattern, and
a concentration of the silicon dopant in the first region of the lower electrode is higher than a concentration of the silicon dopant in the second region of the lower electrode.

13. The semiconductor device of claim 12, wherein the first region of the lower electrode includes the outer surface of the lower electrode, and
the second region of the lower electrode comprises a portion that is devoid of the silicon dopant.

14. The semiconductor device of claim 13, wherein the dielectric film extends along the first region of the lower electrode.

15. The semiconductor device of claim 12, wherein the lower electrode includes a metal silicon nitride film extending along the outer surface of the lower electrode, and
the metal silicon nitride film does not extend between the lower electrode and the supporter pattern.

16. The semiconductor device of claim 12, further comprising:
an insertion film between the lower electrode and the dielectric film,
wherein the insertion film does not extend along the outer surface of the support pattern.

17. A semiconductor device comprising:
a trench in a substrate;
a gate electrode in the trench;
a buried contact adjacent to a side of the gate electrode and connected to the substrate;
a landing pad on the buried contact;
an etching stop film that is on the landing pad and exposes at least a portion of the landing pad;
a first supporter pattern that is on the etching stop film, and is spaced apart from the etching stop film, and has a first thickness;
a second supporter pattern that is on the first supporter pattern, and is spaced apart from the first supporter pattern, and has a second thickness greater than the first thickness;
a lower electrode that is on the landing pad and is in contact with the etching stop film, the first supporter pattern, and the second supporter pattern;
an insertion film on the lower electrode;
a dielectric film extending along the insertion film, the first supporter pattern, and the second supporter pattern; and
an upper electrode on the dielectric film,
wherein the lower electrode includes a silicon doped region including a portion of an outer surface of the lower electrode, and
the insertion film extends on the silicon doped region.

18. The semiconductor device of claim 17, wherein the insertion film does not extend between the lower electrode and the first supporter pattern, does not extend between the lower electrode and the second supporter pattern, and does not extend between the lower electrode and the etching stop film.

19. The semiconductor device of claim 17, wherein the lower electrode includes a TiN film, and
the silicon doped region includes a TiN film doped with silicon.

20. The semiconductor device of claim 17, further comprising:
   an upper plate electrode on the upper electrode,
   wherein the upper electrode includes a TiN film, and
   the upper electrode includes a silicon doped region along an interface with the upper plate electrode.

* * * * *